(12) United States Patent
Sasaki

(10) Patent No.: US 9,705,044 B2
(45) Date of Patent: Jul. 11, 2017

(54) SEMICONDUCTOR DEVICE AND METHOD FOR MANUFACTURING SAME

(71) Applicant: Sharp Kabushiki Kaisha, Osaka-shi, Osaka (JP)

(72) Inventor: Hiroshi Sasaki, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 26 days.

(21) Appl. No.: 14/761,713

(22) PCT Filed: Dec. 6, 2013

(86) PCT No.: PCT/JP2013/007193
§ 371 (c)(1),
(2) Date: Jul. 17, 2015

(87) PCT Pub. No.: WO2014/122709
PCT Pub. Date: Aug. 14, 2014

(65) Prior Publication Data
US 2015/0357525 A1    Dec. 10, 2015

(30) Foreign Application Priority Data

Feb. 7, 2013  (JP) ................................. 2013-022736

(51) Int. Cl.
*H01L 33/10* (2010.01)
*H01L 33/46* (2010.01)
(Continued)

(52) U.S. Cl.
CPC .............. *H01L 33/46* (2013.01); *H01S 5/125* (2013.01); *H01S 5/18369* (2013.01);
(Continued)

(58) Field of Classification Search
CPC .. H01L 33/46; H01L 2933/0025; H01S 5/125
See application file for complete search history.

(56) References Cited

U.S. PATENT DOCUMENTS

| | | | |
|---|---|---|---|
| 4,489,101 A | 12/1984 | Shibata | |
| 2010/0226402 A1* | 9/2010 | Maeda | B82Y 20/00 372/45.01 |
| 2011/0316026 A1* | 12/2011 | Kim | H01L 33/10 257/98 |

FOREIGN PATENT DOCUMENTS

| | | |
|---|---|---|
| JP | 56-020165 A | 2/1981 |
| JP | 60-053028 A | 3/1985 |

(Continued)

OTHER PUBLICATIONS

V. Passi, A. Lecestre, C. Krzeminski, G. Larrieu, E. Dubois, J.-P. Raskin, "A single layer hydrogen silsesquioxane (HSQ) based lift-off process for germanium and platinum", Microelectronic Engineering, vol. 87, pp. 1872-1878, 2010.*

(Continued)

*Primary Examiner* — Su C Kim
*Assistant Examiner* — David S Wilbert
(74) *Attorney, Agent, or Firm* — Keating & Bennett, LLP

(57) ABSTRACT

To suppress or prevent erosion (decrease in film thickness), water absorption, or cracking of a DBR film surface in washing or etching treatment in a downstream process. The DBR film structure of a DBR film 7D includes a pair of or a plurality of pairs of a deposited $SiO_2$ film and a deposited $TiO_2$ film. Such a top layer of DBR film structures has hitherto been a deposited $SiO_2$ film that provides high reflectance. In order to prevent erosion while maintaining high reflectance, the top layer herein is a high-refractive-index thin film (for example, a deposited $TiO_2$ film) having a thickness in the range of 1 to 13 nm, and a tapered DBR end portion (a slope having a taper angle in the range of 15 to 45 degrees) is formed by vapor deposition in a lift-off process. The high-refractive-index thin film is overlaid with a reflective metal film 8D serving as a first layer.

5 Claims, 13 Drawing Sheets

(51) Int. Cl.
*H01S 5/125* (2006.01)
*H01S 5/183* (2006.01)
(52) U.S. Cl.
CPC .. *H01S 5/18377* (2013.01); *H01L 2933/0025* (2013.01); *H01S 5/18305* (2013.01)

(56) References Cited

FOREIGN PATENT DOCUMENTS

| | | | |
|---|---|---|---|
| JP | 09-236859 | A | 9/1997 |
| JP | 2011-166146 | A | 8/2011 |
| JP | 2012-511252 | A | 5/2012 |
| JP | 2012-511253 | A | 5/2012 |
| WO | 2010/065249 | A2 | 6/2010 |
| WO | 2010/077287 | A1 | 7/2010 |
| WO | 2013/157179 | A1 | 10/2013 |
| WO | 2013/161146 | A1 | 10/2013 |

OTHER PUBLICATIONS

Official Communication issued in International Patent Application No. PCT/JP2013/007193, mailed on Feb. 4, 2014.

\* cited by examiner

SEMICONDUCTOR DEVICE AND METHOD FOR MANUFACTURING SAME

TECHNICAL FIELD

The present invention relates to semiconductor devices, for example, semiconductor light-emitting devices, such as light-emitting diode devices and semiconductor laser devices, having a distributed Bragg reflector, and a method for producing the semiconductor devices.

BACKGROUND ART

A technique for forming a reflective metal film or a distributed Bragg reflector (DBR) on a lower surface of a transparent substrate, such as sapphire, has been widely studied as a study for improving the light extraction efficiency of a light-emitting diode chip, which is a known semiconductor light-emitting device of this type.

FIG. 12 is a cross-sectional view illustrating a known light-emitting diode chip having a distributed Bragg reflector disclosed in Patent Literature 1. FIG. 13 is an enlarged cross-sectional view of the distributed Bragg reflector of FIG. 12.

As illustrated in FIG. 12, a known light-emitting diode chip 100 includes a substrate 101, a buffer layer 102 on the front side of the substrate 101, a light-emitting structural body 103 on the buffer layer 102, a transparent electrode 104 on the light structural body 103, a p-electrode pad 105 on part of the transparent electrode 104, and a n-electrode pad 106 on part of a partly exposed surface of a first conductivity type semiconductor layer 103a of the light structural body 103. The light-emitting diode chip 100 further includes a distributed Bragg reflector 107 on the back side of the substrate 101, a reflective metal layer 108 on the distributed Bragg reflector 107, and a protective layer 109 on the reflective metal layer 108.

The substrate 101 may be any transparent substrate, for example, a sapphire or SiC substrate. The substrate 101 may have a predetermined asperity pattern on an upper surface, that is, over the entire surface, as in a patterned sapphire substrate (PSS). The total area of the chip depends on the area of the substrate 101. The reflection effect increases with the area of the light-emitting diode chip 100.

The light-emitting structural body 103 includes the first conductivity type semiconductor layer 103a, a second conductivity type semiconductor layer 103b, and an active layer 103c, which is disposed between the first conductivity type semiconductor layer 103a and the second conductivity type semiconductor layer 103b. The first conductivity type semiconductor layer 103a and the second conductivity type semiconductor layer 103b are of opposite conductivity types. The first conductivity type may be a n type, and the second conductivity type may be a p type, and vice versa.

The first conductivity type semiconductor layer 103a, the active layer 103c, and the second conductivity type semiconductor layer 103b may be formed of a gallium nitride compound semiconductor substance (Al, In, Ga)N. The composition elements and the component ratio of the active layer 103c are determined such that light having an intended wavelength, for example, ultraviolet light or blue light can be emitted. The first conductivity type semiconductor layer 103a and/or the second conductivity type semiconductor layer 103b may be a monolayer as illustrated in the figure or may have a multilayer structure. The active layer 103c may have a single-quantum-well structure or a multiple-quantum-well structure. The buffer layer 102 between the substrate 101 and the first conductivity type semiconductor layer 103a may be omitted.

The semiconductor layers 103a to 103c may be formed by a metal-organic chemical vapor deposition (MOCVD) or molecular beam epitaxy (MBE) technique and may be patterned in a photolithography and etching process so as to expose part of the first conductivity type semiconductor layer 103a.

The transparent electrode layer 104 may be formed of ITO or Ni/Au on the second conductivity type semiconductor layer 103b. The transparent electrode layer 104, which has a lower specific resistance than the second conductivity type semiconductor layer 103b, functions to disperse the electric current over the entire chip. The p-electrode pad 105 is disposed on part of the transparent electrode 104, and the n-electrode pad 106 is disposed on part of a partly exposed surface of the first conductivity type semiconductor layer 103a. As illustrated in the figure, the p-electrode pad 105 is electrically connected to the second conductivity type semiconductor layer 103b through the transparent electrode layer 104.

The distributed Bragg reflector 107 is disposed on the lower portion of the substrate 101, that is, the back side of the substrate 101. The distributed Bragg reflector 107 includes a first distributed Bragg reflector 111 and a second distributed Bragg reflector 112.

As illustrated in FIG. 13, the first distributed Bragg reflector 111 includes a plurality of pairs of a first material layer 111a and a second material layer 111b, and the second distributed Bragg reflector 112 includes a plurality of pairs of a third material layer 112a and a fourth material layer 112b. The plurality of pairs of the first material layer 111a and the second material layer 111b may have higher reflectance for light in a red wavelength region, for example, light having a wavelength in the range of 550 or 630 nm than light in a blue wavelength region. The second distributed Bragg reflector 112 may have higher reflectance for light in a blue wavelength region, for example, light having a wavelength of 460 nm than light in a red or green wavelength region. Although the optical thickness of the material layers 111a and 111b of the first distributed Bragg reflector 111 is greater than the optical thickness of the material layers 112a and 112b of the second distributed Bragg reflector 112, the former may be smaller than the latter.

The material and the refractive index of the first material layer 111a may be the same as the material and the refractive index of the third material layer 112a. The material and the refractive index of the second material layer 111b may be the same as the material and the refractive index of the fourth material layer 112b. For example, the first material layer 111a and the third material layer 112a may be formed of a $TiO_2$ film (refractive index n: approximately 2.5), and the second material layer 111b and the fourth material layer 112b may be formed of a $SiO_2$ film (refractive index n: approximately 1.5). In short, 48 layers composed of high-refractive-index films and low-refractive-index films alternately stacked on top of one another have high reflectance in a wide wavelength band.

There is essentially an integral multiple relationship between the optical thickness (refractive index×thickness) of the first material layer 111a and the optical thickness of the second material layer 111b. Preferably, these optical thicknesses may be substantially the same. There is essentially an integral multiple relationship between the optical thickness of the third material layer 112a and the optical thickness of the fourth material layer 112b. Preferably, these optical thicknesses may be substantially the same.

The first material layer 111a may have a higher optical thickness than the third material layer 112a, and the second material layer 111b may have a higher optical thickness than the fourth material layer 112b. The optical thicknesses of the first to fourth material layers 111a, 111b, 112a, and 112b can be controlled by adjusting the refractive index and/or actual thickness of each of the material layers.

The reflective metal layer 108, such as Al, Ag, or Rh, and the protective layer 109 for protecting the distributed Bragg reflector 107 may be disposed on the lower portion of the distributed Bragg reflector 107. The protective layer 109 may be a metal layer selected from Ti, Cr, Ni, Pt, Ta, and Au, or may be formed of an alloy thereof. The reflective metal layer 108 or the protective layer 109 can protect the distributed Bragg reflector 107 from external impact and contamination. For example, the reflective metal layer 108 or the protective layer 109 can prevent the distributed Bragg reflector 107 from being deformed by a substance, such as an adhesive, during mounting of the light-emitting diode chip 100 in a light-emitting diode package.

The reflective metal layer 108 can reflect light passing through the distributed Bragg reflector 107 and can therefore relatively decrease the thickness of the distributed Bragg reflector 107. The distributed Bragg reflector 107 has a relatively high reflectance but may transmit visible light in a long-wavelength region at high incident angles. Thus, the reflective metal layer 108 disposed on the lower portion of the distributed Bragg reflector 107 can reflect light passing through the distributed Bragg reflector 107 and further improve light-use efficiency.

An arrangement of the first distributed Bragg reflector 111 disposed closer to the substrate 101 than the second distributed Bragg reflector 112 can have smaller optical loss in the distributed Bragg reflector 107 than an arrangement of the first distributed Bragg reflector 111 disposed more distant from the substrate 101 than the second distributed Bragg reflector 112.

The light-emitting diode chip 100 having such a structure is a known semiconductor light-emitting device of a face-up light emission type and can emit light from the active layer 103c entirely upward through the p-electrode pad 105 and the n-electrode pad 106.

CITATION LIST

Patent Literature

PTL 1: Japanese Unexamined Patent Application Publication No. 2011-166146

SUMMARY OF INVENTION

Technical Problem

The known light-emitting diode chip 100 having the distributed Bragg reflector 107 disclosed in Patent Literature 1 includes the distributed Bragg reflector 107 (DBR film) on the back side of the substrate 101. The distributed Bragg reflector 107 upwardly reflects light emitted from the light-emitting structural body including the internal active layer 103c. The distributed Bragg reflector 107 is overlaid with the reflective metal layer 108. The distributed Bragg reflector 107 and the overlying reflective metal layer 108 have a reflectance of 90 percent or more for blue, green, and red wavelength light.

Although a DBR film (reflective film) composed of approximately 40 layers (the final layer is $SiO_2$ from the perspective of reflectance) of $SiO_2$ and $TiO_2$ alternately stacked on the substrate 101 has high reflectance in a wide wavelength band, there are problems that hydrofluoric acid in washing treatment in a downstream process erodes the DBR film surface (reduces the film thickness) and causes water absorption or cracks of the DBR film surface, thereby changing the optical properties of the DBR film.

The present invention solves these existing problems and aims to provide a semiconductor device that can suppress or prevent erosion (decrease in film thickness), water absorption, or cracking of a DBR film surface in washing or etching treatment in a downstream process, and a method for producing the semiconductor device.

Solution to Problem

A semiconductor device according to the present invention includes a DBR film structure serving as a reflective film, wherein a high-refractive-index film for preventing erosion is continuously formed as a final film on a low-refractive-index film in a pair of or a plurality of pairs of the high-refractive-index film and the low-refractive-index film formed on the low-refractive-index film. Such a semiconductor device can achieve the object.

Preferably, in a semiconductor device according to the present invention, the low-refractive-index film is a $SiO_2$ film, the high-refractive-index film is a $TiO_2$ film, and the final $TiO_2$ film has a thickness in the range of 1 to 13 nm.

Preferably, the final $TiO_2$ film in a semiconductor device according to the present invention has a thickness in the range of 1 to 10 or 1 to 5 nm.

Preferably, in a semiconductor device according to the present invention, the DBR film structure has a sloped pattern edge portion, and the thickness of the pattern edge portion decreases toward the edge at a cross-sectional taper angle in the range of 15 to 45 degrees.

Preferably, in a semiconductor device according to the present invention, the DBR film structure includes a multilayer reflective film composed of 4 to 50 layers.

Preferably, a semiconductor device according to the present invention further includes a metal film (reflective metal film) on the DBR film structure (DBR film) and on an underlayer of the DBR film structure.

Preferably, in a semiconductor device according to the present invention, the metal film is an Al film.

Preferably, in a semiconductor device according to the present invention, a Ni film is used as an adhesion layer between the final high-refractive-index film and the metal film, or the metal film is directly disposed on the final high-refractive-index film.

Preferably, in a semiconductor device according to the present invention, the reflectance of light having a wavelength in the range of 400 to 600 nm is 80 percent or more in a direction perpendicular to the DBR film structure.

A method for producing a semiconductor device according to the present invention is a method for producing the semiconductor device according to the present invention and includes a lift-off process of forming a resist pattern having an overhang in cross-section, forming the slope of the DBR film structure around the overhang of the resist pattern by DBR vapor deposition treatment, and removing the resist pattern. Such a method for producing a semiconductor device can achieve the object.

Preferably, in a method for producing a semiconductor device according to the present invention, plasma cleaning with an ion gun and the DBR vapor deposition treatment are performed before and during vapor deposition of the DBR film structure.

Preferably, in a method for producing a semiconductor device according to the present invention, after the slope of the DBR film structure is formed in the lift-off process, a metal film is formed on the DBR film structure and on an underlayer of the DBR film structure by metal film deposition in the lift-off process.

The operation of the present invention will be described below with respect to the structure described above.

In the present invention, a semiconductor device includes a DBR film structure serving as a reflective film, wherein a high-refractive-index film for preventing erosion is continuously formed as a final film on a low-refractive-index film in a pair of or a plurality of pairs of the high-refractive-index film and the low-refractive-index film formed on the low-refractive-index film.

Since the final film is the high-refractive-index film for preventing erosion, the high-refractive-index film for preventing erosion can cover the DBR film structure and protect the interior of the DBR film structure, thereby suppressing or preventing erosion (decrease in film thickness), water absorption, or cracking of the DBR film surface in washing or etching treatment in a downstream process.

In the formation of a reflective metal film on a DBR film, it is difficult to form the reflective metal film on a nonplanar surface of the DBR film by vapor deposition, and a pattern edge portion of the DBR film is insufficiently covered with a deposited film, thus causing step discontinuity. In contrast, the DBR film structure has a sloped pattern edge portion (end), and the thickness of the pattern edge portion decreases toward the edge at a cross-sectional taper angle in the range of 15 to 45 degrees. Thus, the pattern edge portion (end) of the DBR film is sufficiently covered with a deposited film (reflective metal film), thus causing no step discontinuity.

The light-emitting diode chip 100 disclosed as a known semiconductor light-emitting device in Patent Literature 1 is of the face-up light emission type, and the p-electrode pad 105 and the n-electrode pad 106 block light emitted from the active layer 103c and decrease light emission efficiency. In contrast, in a next-generation semiconductor light-emitting device of a face-down type (flip chip), light is entirely emitted downward in a direction away from the p-electrode pad and the n-electrode pad and is not blocked by the p-electrode pad and the n-electrode pad, thus preventing a decrease in light emission efficiency.

Advantageous Effects of Invention

Thus, the present invention can suppress or prevent erosion (decrease in film thickness), water absorption, or cracking of a DBR film surface in washing or etching treatment in a downstream process.

The DBR film structure has a sloped pattern edge portion, and the thickness of the pattern edge portion decreases toward the edge at a cross-sectional taper angle in the range of 15 to 45 degrees. Thus, the pattern edge portion of the DBR film is sufficiently covered with a deposited film, thus preventing step discontinuity.

Figure 1:
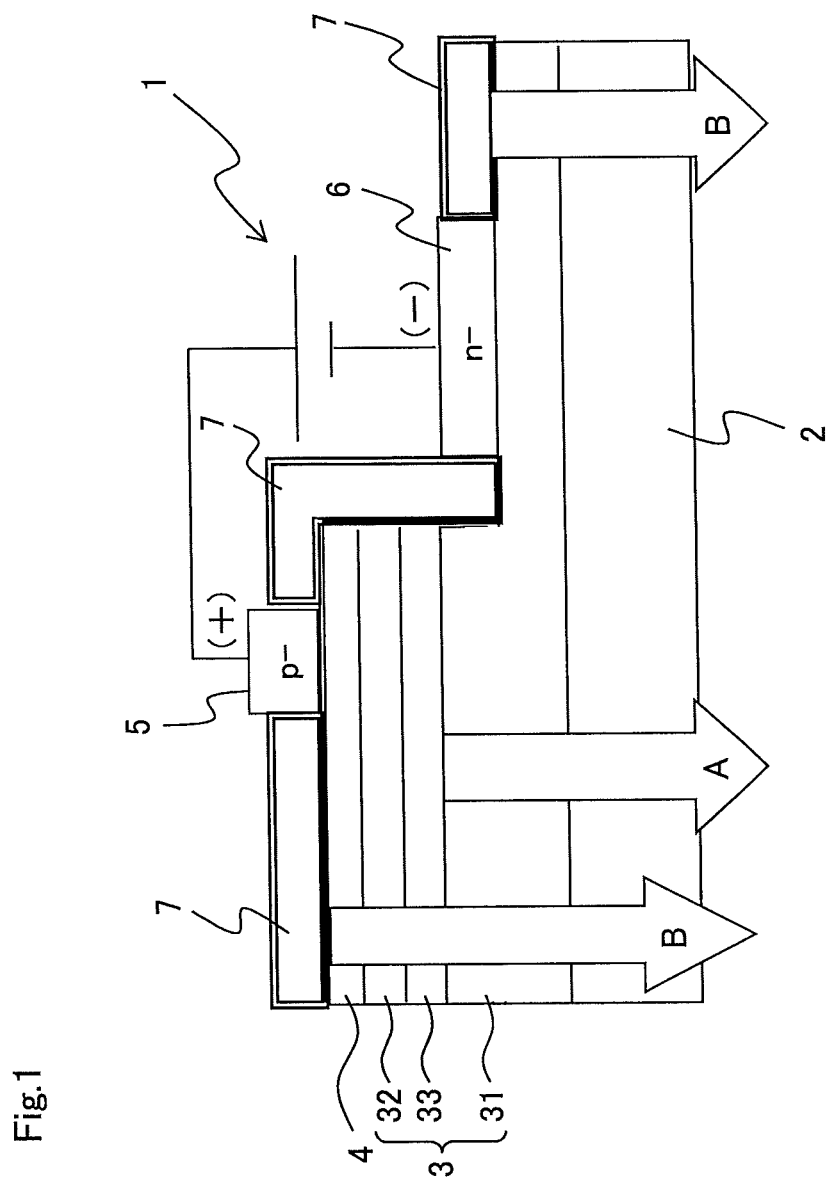
FIG. 1 is a longitudinal sectional view of a principal part structure example of a semiconductor light-emitting device of a face-down light emission type according to a first embodiment of the present invention.

REFERENCE SIGNS LIST 1, 1A to 1E, 1E' Semiconductor light-emitting device
2 Transparent insulator substrate
3, 3C, 3D Light-emitting structural body
31 First conductivity type semiconductor layer 31 (N-type clad layer)
32 Second conductivity type semiconductor layer 32 (P-type clad layer)
33 Active layer
4 Transparent electrode film
5, 5A p-electrode pad
6, 6A n-electrode pad
7, 7A to 7E DBR film
8, 8D, 8E, 8E' Metal reflective film (for example, reflective metal (Al) film)
9 Opening in DBR film
10 Photoresist for DBR film
10A, 11 Photoresist for reflective metal film
12 N-type semiconductor substrate
13 Light-emitting structural body
131 First conductivity type semiconductor layer 131 (N-type clad layer)
132 Second conductivity type semiconductor layer 132 (P-type clad layer)
133 Active layer
14 DBR film or reflective metal film
15 Upper P-electrode film
16 Lower N-electrode film

DESCRIPTION OF EMBODIMENTS

Application of a semiconductor device and a method for producing the semiconductor device according to the present invention to semiconductor light-emitting devices and methods for producing the semiconductor light-emitting devices according to first to sixth embodiments will be described in detail below with reference to the accompanying drawings. The thickness and length of components in the drawings are not limited to those illustrated in the drawings from the perspective of making the drawings.

First Embodiment

FIG. 1 is a longitudinal sectional view of a principal part structure example of a semiconductor light-emitting device of a face-down light emission type according to a first embodiment of the present invention.

In FIG. 1, a semiconductor light-emitting device 1 constituting the light-emitting diode device serving as a semiconductor device according to the first embodiment is a next-generation flip chip of a face-down light emission type and includes a DBR film 7 (reflective film structure) as a distributed Bragg reflector. The DBR film 7 includes a high-refractive-index film ($TiO_2$ film) as the top layer.

The semiconductor light-emitting device 1 according to the first embodiment includes a light-emitting structural body 3 on a transparent insulator substrate 2, for example, made of sapphire. The light-emitting structural body 3 includes an active layer 33 between a first conductivity type semiconductor layer 31 (N-type clad layer) and a second conductivity type semiconductor layer 32 (P-type clad layer). The active layer 33 can emit light. The light-emitting structural body 3 has recessed and raised portions on its surface. A transparent electrode film 4 formed of an ITO film is disposed on a flat surface of a raised portion of the light-emitting structural body 3. A p-electrode pad 5 is disposed on part of the surface of the transparent electrode film 4. A n-electrode pad 6 is disposed on part of a partly exposed surface (recessed portion) of the first conductivity type semiconductor layer 31 in the light-emitting structural body 3. The DBR film 7 is disposed on the transparent electrode film 4 except the p-electrode pad 5, on the transparent electrode film 4 and on a side surface down to a partly exposed surface of the first conductivity type semiconductor layer 31, and on the partly exposed surface of the first conductivity type semiconductor layer 31 except the n-electrode pad 6. The DBR film 7 has a reflective film structure constituting the distributed Bragg reflector.

A predetermined voltage is applied between the p-electrode pad 5, which serves as a positive electrode, and the n-electrode pad 6, which serves as a negative electrode, thereby applying a predetermined voltage to the light-emitting structural body 3. Light emitted from the active layer 33 in the light-emitting structural body 3 passes through the transparent insulator substrate 2 and is output from the back side of the substrate as light emission A. Light emitted from the active layer 33 is also reflected by the DBR film 7, passes through the transparent insulator substrate 2, and is output from the back side of the substrate as reflected light B. Thus, substantially all light emission is output downward from the back side of the transparent insulator substrate 2.

In the first embodiment, the high-refractive-index film ($TiO_2$ film) is negligibly etched with BHF and is resistant to acids and water (impermeable to water). Thus, the $TiO_2$ film serving as the final film of the DBR film 7 can protect the inner $SiO_2$ films from acids and water.

The DBR film 7 is composed of a plurality of pairs of a first material layer formed of a low-refractive-index film and a second material layer formed of a high-refractive-index film. The high-refractive-index film (deposited $TiO_2$ film) for preventing erosion is continuously formed as the final film on a top low-refractive-index film (deposited $SiO_2$ film) of a pair of or a plurality of pairs of the high-refractive-index film (deposited $TiO_2$ film) and the low-refractive-index film (deposited $SiO_2$ film) disposed on the low-refractive-index film (deposited $SiO_2$ film), as in the low-refractive-index film (deposited $SiO_2$ film)/high-refractive-index film (deposited $TiO_2$ film)/low-refractive-index film (deposited $SiO_2$ film). The DBR film 7 is composed of 4 to 50 layers.

Thus, in the DBR film 7 serving as a reflective film of the semiconductor light-emitting device 1 of the face-down light emission type according to the first embodiment, the high-refractive-index film (deposited $TiO_2$ film) for preventing erosion (for protecting the interior) is continuously formed as the final film on the low-refractive-index film (deposited $SiO_2$ film) of a pair of or a plurality of pairs of the high-refractive-index film (deposited $TiO_2$ film) and the low-refractive-index film (deposited $SiO_2$ film) disposed on the low-refractive-index film (deposited $SiO_2$ film).

In short, although such a top layer has hitherto been a deposited $SiO_2$ film having a low refractive index, which can be eroded by acids, an additional deposited $TiO_2$ film having a high refractive index is continuously formed in the present embodiment. The deposited $TiO_2$ film serving as the final film disposed on the top surface of the deposited $SiO_2$ film in the DBR film 7 can prevent erosion (decrease in film thickness), water absorption, and cracking of the DBR top layer film in etching or washing treatment in a downstream process.

In the first embodiment, the semiconductor light-emitting device 1 of the face-down light emission type is a next-generation flip chip including the DBR film 7 and includes the high-refractive-index film (TiO$_2$ film) as the top layer of the DBR film 7. The DBR film structure including the high-refractive-index film (TiO$_2$ film) as the top layer of the DBR film 7 is not limited to this and may be applied to semiconductor light-emitting devices of a face-up light emission type. Such a semiconductor light-emitting device of a face-up light emission type will be described in detail below in a second embodiment.

Second Embodiment

Figure 2:
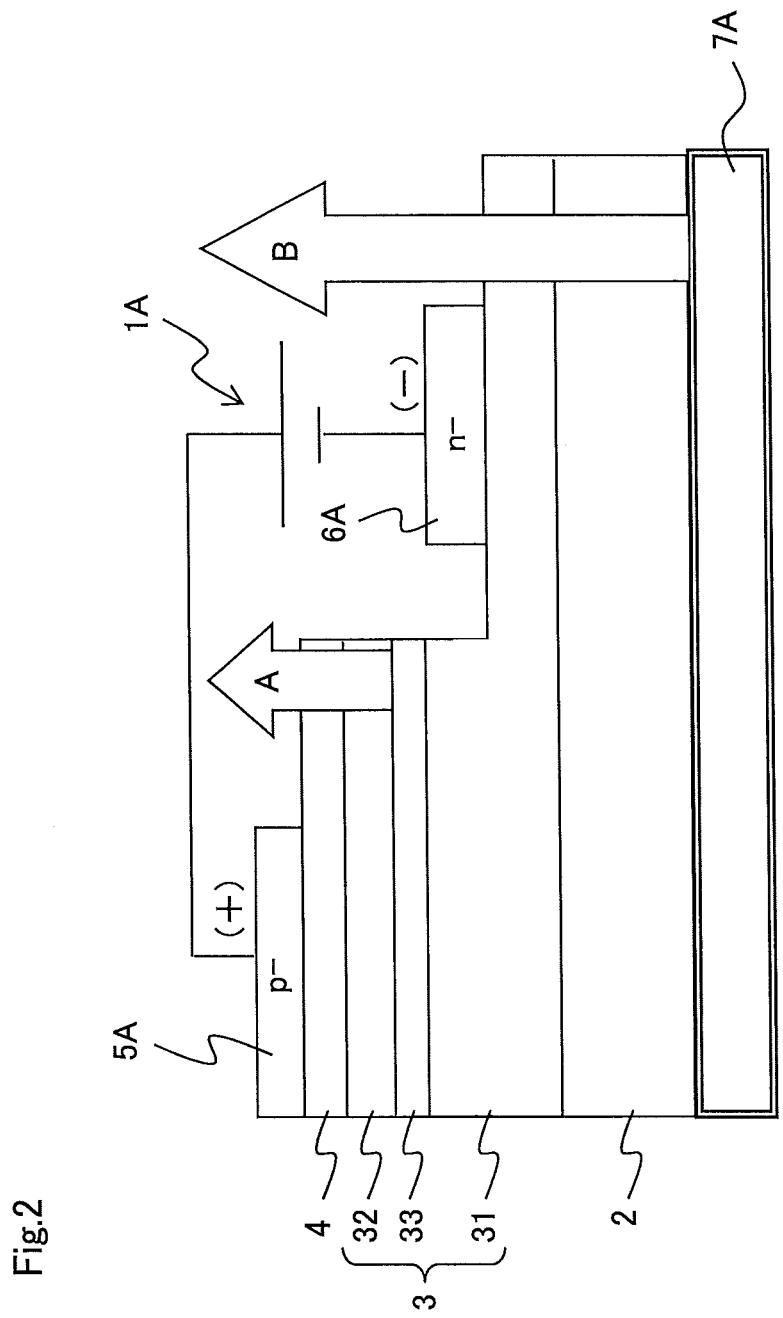
FIG. 2 is a longitudinal sectional view of a principal part structure example of a semiconductor light-emitting device of a face-up light emission type according to a second embodiment of the present invention.

FIG. 2 is a longitudinal sectional view of a principal part structure example of a semiconductor light-emitting device of a face-up light emission type according to the second embodiment of the present invention.

In FIG. 2, a semiconductor light-emitting device 1A constituting the light-emitting diode device serving as a semiconductor device according to the second embodiment is a semiconductor chip of a face-up light emission type and includes a DBR film 7A on the back side of the substrate. The DBR film 7A includes a high-refractive-index film (TiO$_2$ film) as the top layer.

The semiconductor light-emitting device 1A according to the first embodiment includes a light-emitting structural body 3 on a transparent insulator substrate 2, for example, made of sapphire. The light-emitting structural body 3 includes an active layer 33 between a first conductivity type semiconductor layer 31 (N-type clad layer) and a second conductivity type semiconductor layer 32 (P-type clad layer). The active layer 33 can emit light. The light-emitting structural body 3 has recessed and raised portions on its surface. A transparent electrode film 4 formed of an ITO film is disposed on a flat surface of a raised portion of the light-emitting structural body 3. A p-electrode pad 5A having a reflective layer on its bottom is disposed on part of the surface of the transparent electrode film 4. A n-electrode pad 6A having a reflective layer on its bottom is disposed on part of a partly exposed surface of the first conductivity type semiconductor layer 31 in the light-emitting structural body 3. The DBR film 7A is disposed on the back side of the transparent insulator substrate 2.

A predetermined voltage is applied between the p-electrode pad 5A, which serves as a positive electrode, and the n-electrode pad 6A, which serves as a negative electrode, thereby applying a predetermined voltage to the light-emitting structural body 3. Light emitted from the active layer 33 in the light-emitting structural body 3 passes through the transparent electrode film 4 and is output from the front side as light emission A. Light emitted from the active layer 33 is also reflected by the DBR film 7A on the back side of the transparent insulator substrate 2 and is output from the front side of the substrate as reflected light B. The remainder of the light emitted from the active layer 33 is reflected by the reflective layer on the bottom of each of the p-electrode pad 5A and the n-electrode pad 6A toward the DBR film 7A. Thus, substantially all light emitted from the active layer 33 is output upward from the front side of the substrate.

In the second embodiment, the TiO$_2$ film having a high refractive index is negligibly etched with BHF and is resistant to acids and water (impermeable to water). Thus, the TiO$_2$ film serving as the final film of the DBR film 7A can protect the inner SiO$_2$ films from acids and water.

The DBR film 7A is composed of a plurality of pairs of a first material layer formed of a low-refractive-index film and a second material layer formed of a high-refractive-index film. The high-refractive-index film (deposited TiO$_2$ film) for preventing erosion is continuously formed as the final film on a top low-refractive-index film (deposited SiO$_2$ film) of a pair of or a plurality of pairs of the high-refractive-index film (deposited TiO$_2$ film) and the low-refractive-index film (deposited SiO$_2$ film) disposed on the low-refractive-index film (deposited SiO$_2$ film), as in the low-refractive-index film (deposited SiO$_2$ film)/high-refractive-index film (deposited TiO$_2$ film)/low-refractive-index film (deposited SiO$_2$ film). The multilayer reflective film of the DBR film 7A is composed of 4 to 50 layers.

Thus, in the DBR film 7A of the semiconductor light-emitting device 1A of the face-up light emission type according to the second embodiment, the high-refractive-index film (deposited TiO$_2$ film) for preventing erosion is continuously formed as the final film on the low-refractive-index film (deposited SiO$_2$ film) of a pair of or a plurality of pairs of the high-refractive-index film (deposited TiO$_2$ film) and the low-refractive-index film (deposited SiO$_2$ film) disposed on the low-refractive-index film (deposited SiO$_2$ film).

In short, although such a top layer has hitherto been a deposited SiO$_2$ film having a low refractive index, which can be eroded by acids, an additional deposited TiO$_2$ film having a high refractive index is continuously formed in the present embodiment. The deposited TiO$_2$ film serving as the final film disposed on the top surface of the deposited SiO$_2$ film in the DBR film 7A can prevent erosion (decrease in film thickness), water absorption, and cracking of the DBR top layer film in etching or washing treatment in a downstream process.

In the known light-emitting diode chip 100 disclosed as a known semiconductor light-emitting device of a face-up light emission type, the p-electrode pad 105 and the n-electrode pad 106 block light emitted from the active layer 103c and decreases light extraction efficiency. Although the p-electrode pad 5A and the n-electrode pad 6A also block light emitted from the active layer 33 in the semiconductor light-emitting device 1A of the face-up light emission type according to the second embodiment, light emitted from the active layer 33 is reflected by the reflective layer on the bottom of each of the p-electrode pad 5A and the n-electrode pad 6A toward the DBR film 7A, is then reflected upward by the DBR film 7A, and is emitted from the front side of the device. Thus, the light extraction efficiency of the semiconductor light-emitting device 1A is higher than that of the known device.

In the semiconductor light-emitting device 1 of the face-down light emission type according to the first embodiment, light emitted from the active layer 33 is reflected by the DBR film 7 disposed on the side of the p-electrode pad 5 and the n-electrode pad 6 and is output from the back side of the device. Thus, the p-electrode pad 5 and the n-electrode pad 6 do not block the light. The next-generation semiconductor light-emitting device 1 of a face-down type (flip chip) that emits light only downward has higher light extraction efficiency than the known light-emitting diode chip 100 of the face-up light emission type or the semiconductor light-emitting device 1A of the face-up light emission type according to the second embodiment because the p-electrode pad 5 or 5A and the n-electrode pad 6 or 6A do not block light. Use of the p-electrode pad 5A and the n-electrode pad 6A, which are the p-electrode pad 5 and the n-electrode pad 6 having a reflective film on the bottom thereof, in the next-generation semiconductor light-emitting device 1 of a face-down type according to the first embodiment can improve light extraction efficiency by reflection on the bottom of each of the p-electrode pad 5A and the n-electrode pad 6A toward the back side of the device.

In these embodiments, the semiconductor light-emitting device 1 of the face-down light emission type according to the first embodiment includes the DBR film 7, the semiconductor light-emitting device 1A of the face-up light emission type according to the second embodiment includes the DBR film 7A, and the top layer of the DBR film 7 or 7A (reflective film) is the high-refractive-index film ($TiO_2$ film). However, the present invention is not limited to these embodiments. A semiconductor light-emitting device having a DBR film structure that includes a high-refractive-index film ($TiO_2$ film) as the top layer of the DBR film 7 or 7A (reflective film) can be applied to semiconductor laser devices as well as the light-emitting diode devices according to the first and second embodiments. Such a semiconductor light-emitting device will be described in detail below in the following third embodiment.

Third Embodiment

Figure 3:
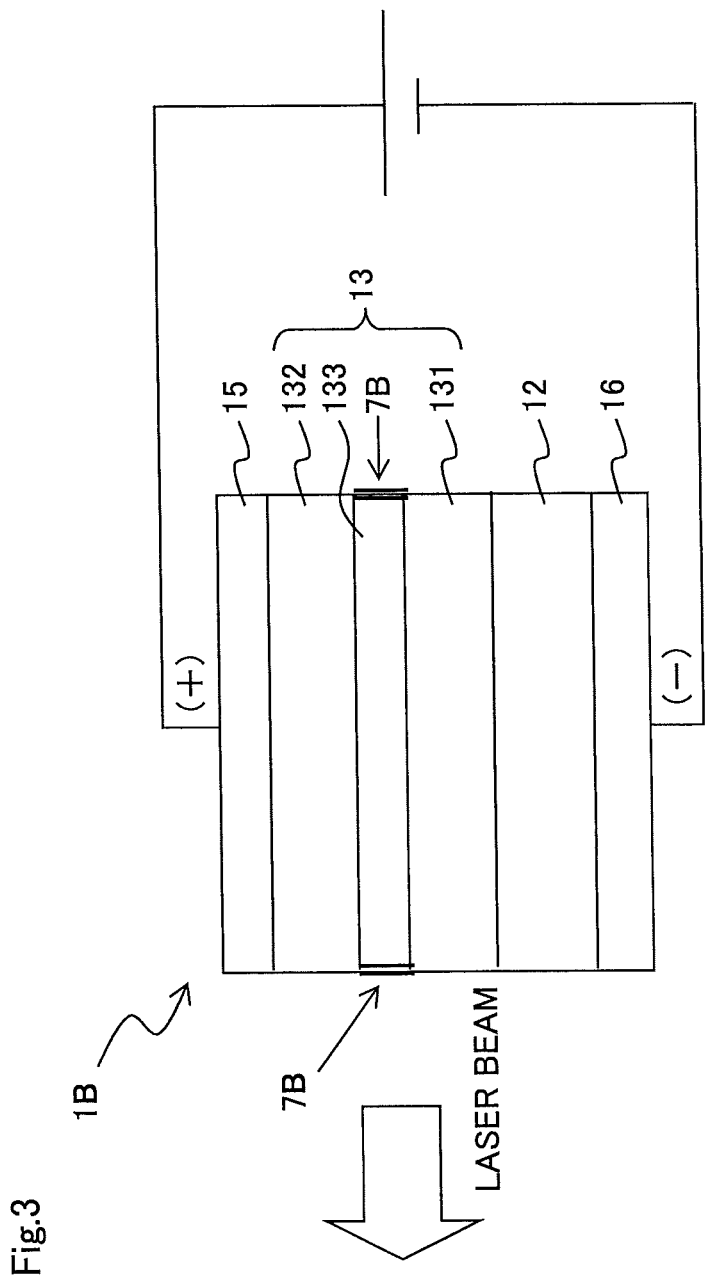
FIG. 3 is a longitudinal sectional view of a principal part structure example of a semiconductor light-emitting device constituting a semiconductor laser device according to a third embodiment of the present invention.

FIG. 3 is a longitudinal sectional view of a principal part structure example of a semiconductor light-emitting device constituting a semiconductor laser device according to the third embodiment of the present invention.

In FIG. 3, a semiconductor light-emitting device 1B that constitutes a semiconductor laser device as the semiconductor device according to the third embodiment includes a DBR film 7B on side surfaces of an active layer 133. The DBR film 7B includes a high-refractive-index film ($TiO_2$ film) as the top layer.

The semiconductor light-emitting device 1B according to the third embodiment includes a light-emitting structural body 13 on a N-type semiconductor substrate 12. The light-emitting structural body 13 includes an active layer 133 between a first conductivity type semiconductor layer 131 (N-type clad layer) and a second conductivity type semiconductor layer 132 (P-type clad layer). The active layer 33 can emit light. An upper P-electrode film 15 is disposed on the second conductivity type semiconductor layer 132 (P-type clad layer). A lower N-electrode film 16 is disposed on the back side of the N-type semiconductor substrate 12. The DBR film 7B is disposed on four side surfaces of the active layer 133. Only on a laser beam exit surface of the four side surfaces of the active layer 133, the reflective film structure of the DBR film 7B and the thickness of the reflective film structure are designed to facilitate the output of a laser beam.

A predetermined voltage is applied between the upper P-electrode film 15, which serves as a positive electrode, and the lower N-electrode film 16, which serves as a negative electrode, thereby applying a predetermined voltage to the light-emitting structural body 13. Light emitted from the active layer 133 in the light-emitting structural body 13 resonates between the opposite DBR films 7B in the active layer 133 and is output as a laser beam from the laser beam exit surface of the DBR film 7B.

In the third embodiment, the $TiO_2$ film having a high refractive index is negligibly etched with BHF and is resistant to acids and water (impermeable to water). Thus, the $TiO_2$ film serving as the final film of the DBR film 7B can protect the inner $SiO_2$ films from acids and water.

The DBR film 7B is composed of a plurality of pairs of a first material layer formed of a low-refractive-index film and a second material layer formed of a high-refractive-index film. The high-refractive-index film (deposited $TiO_2$ film) for preventing erosion is continuously formed as the final film on a top low-refractive-index film (deposited $SiO_2$ film) of a pair of or a plurality of pairs of the high-refractive-index film (deposited $TiO_2$ film) and the low-refractive-index film (deposited $SiO_2$ film) disposed on the low-refractive-index film (deposited $SiO_2$ film), as in the low-refractive-index film (deposited $SiO_2$ film)/high-refractive-index film (deposited $TiO_2$ film)/low-refractive-index film (deposited $SiO_2$ film). The multilayer reflective film of the DBR film 7B is composed of 4 to 50 layers.

Thus, in the DBR film 7B on the side surfaces of the active layer 133 of the semiconductor light-emitting device 1B constituting the semiconductor laser device according to the third embodiment, the high-refractive-index film (deposited $TiO_2$ film) for preventing erosion is continuously formed as the final film on the low-refractive-index film (deposited $SiO_2$ film) of a pair of or a plurality of pairs of the high-refractive-index film (deposited $TiO_2$ film) and the low-refractive-index film (deposited $SiO_2$ film) disposed on the low-refractive-index film (deposited $SiO_2$ film).

In short, although such a top layer has hitherto been a deposited $SiO_2$ film having a low refractive index, which can be eroded by acids, an additional deposited $TiO_2$ film having a high refractive index is continuously formed in the present embodiment. The deposited $TiO_2$ film serving as the final film disposed on the top surface of the deposited $SiO_2$ film in the DBR film 7B can prevent erosion (decrease in film thickness), water absorption, and cracking of the DBR top layer film in etching or washing treatment in a downstream process.

In the light-emitting diode device and semiconductor laser device serving as semiconductor light-emitting devices according to the first to third embodiments, the DBR film 7, 7A, or 7B includes the high-refractive-index film ($TiO_2$ film) as the top layer in order to withstand water and acids (erosion prevention). However, the present invention is not limited to these embodiments. A reflective metal film 8, such as an Al film, described below may be disposed on the DBR film 7, 7A, or 7B to improve reflection efficiency. Such semiconductor light-emitting devices will be described in detail below in fourth and other embodiments.

Fourth Embodiment

In a fourth embodiment described below, as in the DBR film 7 (reflective film) according to the first embodiment, a high-refractive-index film ($TiO_2$ film) is formed as the top layer, and a reflective metal film is formed on the DBR film 7. The two-layer reflective film structure composed of the DBR film 7 and the reflective metal film has good reflection characteristics.

The two-layer reflective film structure including the reflective metal film on the DBR film and having good reflection characteristics can be applied to the first to third embodiments to achieve good reflection characteristics, as described above. More specifically, the reflective metal film, such as an Al film, can be formed on the DBR film 7, 7A, or 7B according to the first to third embodiments to form the two-layer reflective film structure, thereby further improving reflection efficiency.

Figure 4:
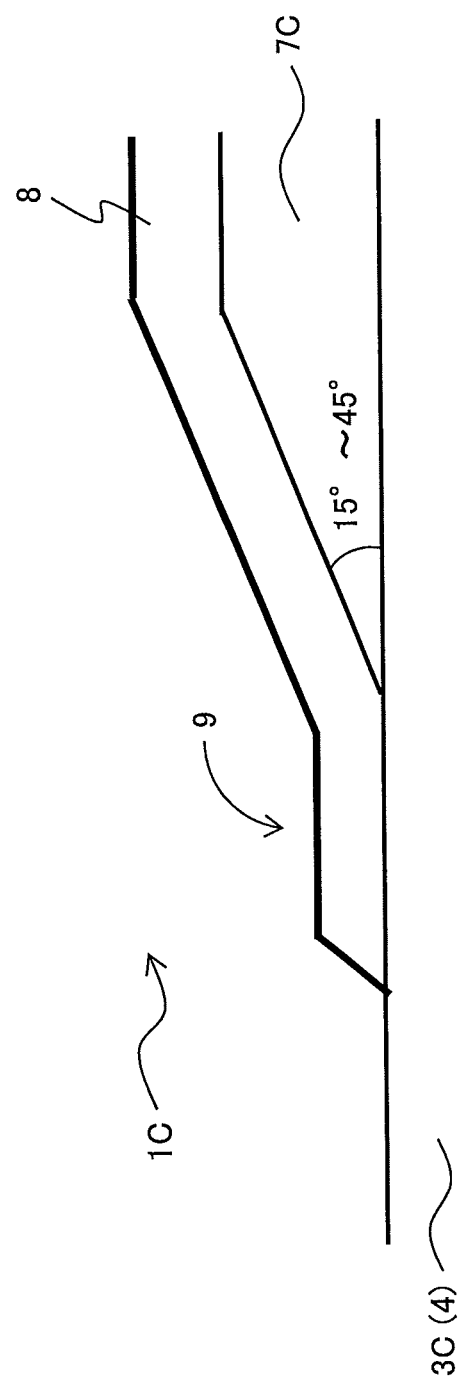
FIG. 4 is a longitudinal sectional view of a principal part structure example of a semiconductor light-emitting device of a face-down light emission type according to a fourth embodiment of the present invention.

In particular, when the two-layer reflective film structure composed of the DBR film 7 and the reflective metal film is applied to the semiconductor light-emitting device 1 of the face-down light emission type according to the first embodiment, in order to prevent step discontinuity of the reflective metal film on an end portion of the DBR film 7, a DBR film 7C having a tapered (sloped) end portion as described below in FIG. 4 is formed from the DBR film 7 by vapor deposition in a lift-off process, and a reflective metal film 8 described below is formed on the DBR film 7C. This will be described in detail below.

FIG. 4 is a longitudinal sectional view of a principal part structure example of a semiconductor light-emitting device of a face-down light emission type according to the fourth embodiment of the present invention.

In FIG. 4, a semiconductor light-emitting device 1C constituting a light-emitting diode device as a semiconductor device according to the fourth embodiment is a next-generation flip chip of a face-down light emission type that includes a DBR film 7C including a high-refractive-index film ($TiO_2$ film) as the top layer and a reflective metal film 8, such as an Al film, disposed on the DBR film 7C.

A tapered pattern end portion of the DBR film 7C is formed on a light-emitting structural body 3C and a transparent electrode film 4 of the semiconductor light-emitting device 1C according to the fourth embodiment in a lift-off process. In this case, the DBR film structure has a sloped pattern edge portion (end), and the thickness of the pattern edge portion decreases toward the edge at a cross-sectional taper angle in the range of 15 to 45 degrees.

When the DBR pattern edge portion has a gentle slope having a predetermined taper angle formed in the lift-off process, this can eliminate a sharp difference between the film thickness of the reflective metal film 8 on the DBR film 7C disposed on the light-emitting structural body 3C and the transparent electrode film 4 and the film thickness of the reflective metal film 8 on the light-emitting structural body 3C and the transparent electrode film 4, thereby preventing step discontinuity at the position where the thickness of the reflective metal film 8 changes.

Thus, the two-layer reflective film structure composed of the DBR film 7C and the reflective metal film 8 according to the fourth embodiment can have better reflection characteristics than known monolayer reflective film structures composed of a DBR film or a reflective metal film.

The underlying films (the light-emitting structural body 3C and the transparent electrode film 4) are subjected to plasma cleaning with an ion gun before and during vapor deposition of the DBR film structure of the DBR film 7C.

Before the reflective metal film 8 is formed on the DBR film 7C by metal evaporation, the surface to be subjected to metal evaporation is pretreated. Because the top film of the DBR film 7C is the $TiO_2$ film, the DBR film 7C can withstand vapor deposition surface treatment using plasma or wet etching.

The reflective metal film 8, for example, made of an Al material is electrically connected to the light-emitting structural body 3C or the transparent electrode film 4 through an opening 9 in the DBR film 7C. Electrodes having a predetermined shape (not shown), such as the p-electrode pad 5 and the n-electrode pad 6A, are formed on the reflective metal film 8 disposed over the opening 9 in the DBR film 7C and are electrically connected to the light-emitting structural body 3C or the transparent electrode film 4 through the reflective metal film 8.

A method for producing the semiconductor light-emitting device 1C of a face-down light emission type according to the fourth embodiment and for producing the two-layer reflective film structure including the reflective metal film 8 on the DBR film 7C will be described in detail below.

Figure 5:
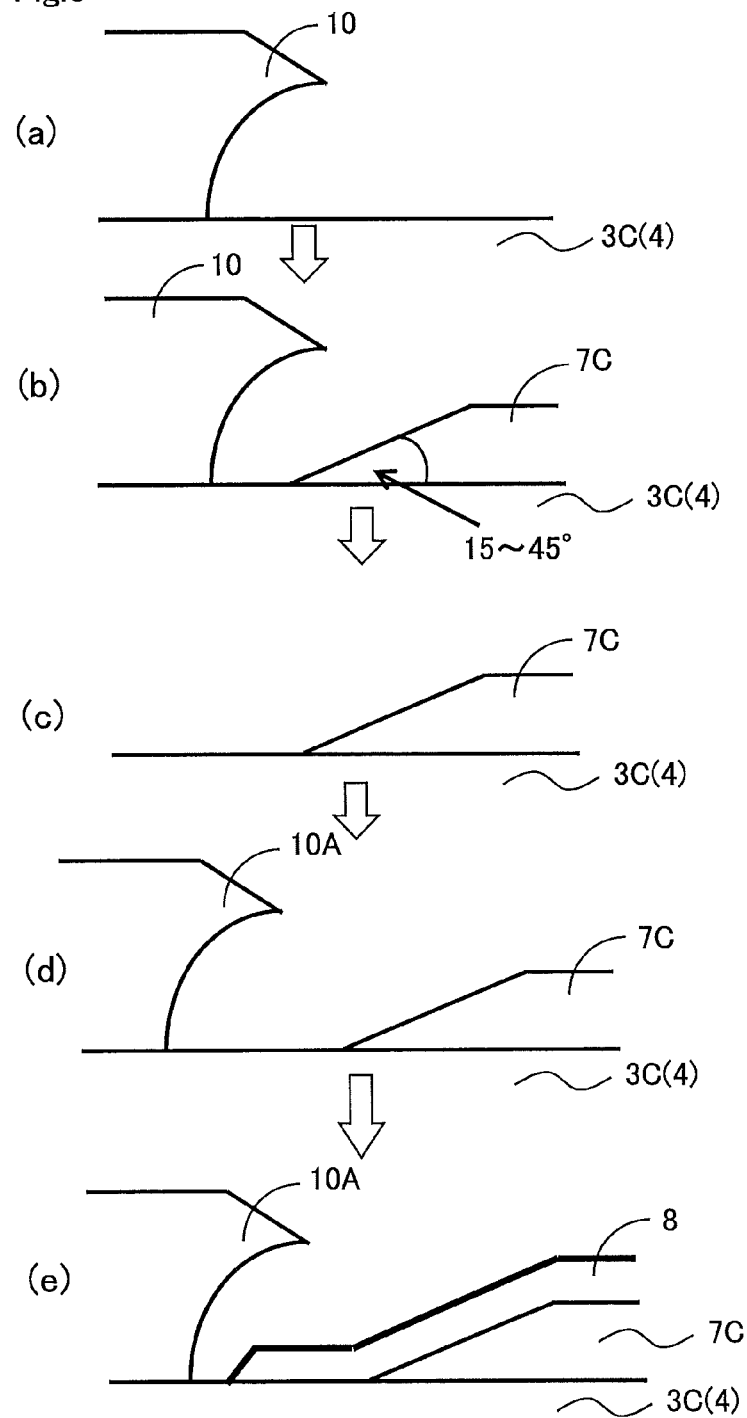
FIG. 5(a) is a cross-sectional view of a principal part illustrating a process of forming a photoresist pattern for a DBR film in the semiconductor light-emitting device according to the fourth embodiment.
FIG. 5(b) is a cross-sectional view of a principal part illustrating a process of DBR film deposition in the semiconductor light-emitting device.
FIG. 5(c) is a cross-sectional view of a principal part illustrating a process of photoresist lift-off in the semiconductor light-emitting device.
FIG. 5(d) is a cross-sectional view of a principal part illustrating a process of forming a photoresist pattern for a reflective metal film in the semiconductor light-emitting device.
FIG. 5(e) is a cross-sectional view of a principal part illustrating a process of reflective metal film deposition in the semiconductor light-emitting device.

FIG. 5(*a*) is a cross-sectional view of a principal part illustrating a process of forming a photoresist pattern for a DBR film in the semiconductor light-emitting device 1C according to the fourth embodiment. FIG. 5(*b*) is a cross-sectional view of a principal part illustrating a process of DBR film deposition in the semiconductor light-emitting device 1C. FIG. 5(*c*) is a cross-sectional view of a principal part illustrating a process of photoresist lift-off in the semiconductor light-emitting device 1C. FIG. 5(*d*) is a cross-sectional view of a principal part illustrating a process of forming a photoresist pattern for a reflective metal film in the semiconductor light-emitting device 1C. FIG. 5(*e*) is a cross-sectional view of a principal part illustrating a process of reflective metal film deposition in the semiconductor light-emitting device 1C.

In the process of forming a photoresist pattern for a DBR film illustrated in FIG. 5(*a*), a photoresist is applied to the entire surface of the light-emitting structural body 3C and the transparent electrode film 4 and is patterned for vapor deposition of the DBR film 7C such that the lower portion is curved inward and has an overhang in cross-section.

In the DBR film deposition process illustrated in FIG. 5(*b*), the multilayer DBR film 7C having a reflection function is formed using the patterned photoresist 10 as a mask. At this time, the multilayer DBR film is also unintentionally formed on the photoresist 10. The DBR film 7C is composed of a plurality of pairs of a first material layer formed of a deposited $SiO_2$ film and a second material layer formed of a deposited $TiO_2$ film. In this case, a deposited $TiO_2$ film for preventing erosion is continuously formed by vapor deposition as the top layer (CAP layer) of the DBR film 7C. The DBR film 7C has a sloped end portion having a small taper angle, and the thickness of the sloped end portion decreases toward the edge. The cross-sectional taper angle ranges from approximately 15 to 45 degrees.

The underlying films (the light-emitting structural body 3C and the transparent electrode film 4) are subjected to plasma cleaning with an ion gun before and during vapor deposition of the DBR film 7C.

After the resist pattern having the overhang in cross-section is formed on the entire surface in the lift-off process, the DBR film 7C having a sloped end portion is formed around the overhang of the photoresist 10 by DBR vapor deposition treatment, and the photoresist 10 is removed in the photoresist lift-off process illustrated in FIG. 5(*c*), thereby exposing part of the light-emitting structural body 3C and the transparent electrode film 4 under the photoresist 10.

Then, after a photoresist is applied to the entire surface of the light-emitting structural body 3C, the transparent electrode film 4, and the DBR film 7C, in the photolithography process for patterning for the reflective metal film illustrated in FIG. 5(*d*), the applied photoresist is patterned for vapor deposition of the reflective metal film such that the lower portion is curved inward and has an overhang in cross-section, thereby forming the photoresist 10A. After that, surface treatment by a wet process or a plasma radiation process is performed as a process before vapor deposition of the reflective metal film 8.

Subsequently, in the reflective metal film deposition process illustrated in FIG. 5(*e*), the photoresist 10A patterned for the reflective metal film such that the lower portion is curved inward and has an overhang in cross-section is used as a mask, and the reflective metal film 8 is formed on the light-emitting structural body 3C and the transparent electrode film 4 by vapor deposition.

At this time, the reflective metal film 8 is also unintentionally formed on the photoresist 10A. Because the thickness of the DBR film 7C having the sloped end portion decreases toward an edge of the DBR film 7C, this can prevent step discontinuity of the reflective metal film 8 between a region on the light-emitting structural body 3C or the transparent electrode film 4 and a region on the DBR film 7C.

The taper angle of the DBR film 7C in the range of 15 to 45 degrees is smaller than the taper angle of 60 degrees at which step discontinuity is likely to occur. Thus, the reflective metal film 8 formed on the slope of the DBR film 7C has no step discontinuity.

After the resist pattern having the overhang in cross-section is formed on the entire surface in the lift-off process, and the sloped end portion of the DBR film 7C is formed, the reflective metal film 8 is formed by metal film deposition on the DBR film 7C and on the underlying light-emitting structural body 3C and transparent electrode film 4 in the lift-off process. The photoresist 10A is then removed in a photoresist lift-off process as illustrated in FIG. 4. In the lift-off process, after a deposited film is formed on an underlayer by vapor deposition using the overhanging photoresist 10 or 10A as a mask, the photoresist 10 or 10A is removed to expose the underlying film on which the photoresist 10 or 10A has been disposed.

The production method including plasma cleaning with an ion gun and the DBR vapor deposition treatment performed before and during vapor deposition of the DBR film 7C in the lift-off process will be further described below.

A method for forming a DBR film using ion plasma before vapor deposition of the DBR film 7C includes a plasma cleaning process of plasma-cleaning the surface of the light-emitting structural body 3C and the transparent electrode film 4 with an ion gun and a DBR deposited film forming process of forming the DBR film 7C on the surface of the light-emitting structural body 3C and the transparent electrode film 4 subjected to plasma cleaning with the ion gun. Thus, after organic substances, water, and other pollutants are removed from the surface of the light-emitting structural body 3C and the transparent electrode film 4 by plasma cleaning, the DBR film 7C is formed on the surface of the light-emitting structural body 3C and the transparent electrode film 4.

As described above, the method for producing the semiconductor light-emitting device 1C constituting a light-emitting diode device of a face-down light emission type as the semiconductor device according to the fourth embodiment includes the lift-off process of forming the resist pattern 10 having an overhang in cross-section, forming the sloped end portion of the DBR film 7C having a cross-sectional taper angle in the range of 15 to 45 degrees by DBR vapor deposition treatment around the overhang of the resist pattern 10, and removing the resist pattern 10. After the slope of the DBR film 7C is formed in the lift-off process, the DBR film structure and the reflective metal film 8, such as an Al film, on the underlayer (the light-emitting structural body 3C and the transparent electrode film 4) are formed by metal film deposition in the lift-off process, thereby forming the two-layer reflective film structure composed of the DBR film 7C and the reflective metal film 8.

The next-generation semiconductor light-emitting device 1C of the face-down type (flip chip) can be produced in this manner. Light emitted from the active layer in the light-emitting structural body 3C is entirely reflected downward by the DBR film 7C and the overlying reflective metal film 8.

Thus, in the fourth embodiment, the high-refractive-index film (TiO$_2$ film) is formed as the top layer of the DBR film 7C and imparts acid resistance and water resistance to the DBR film 7C.

Although such a top layer has hitherto been a SiO$_2$ film in consideration of reflection characteristics, continuous additional formation of the TiO$_2$ film (Cap_TiO$_2$ film formation) as the high-refractive-index film in the film formation structure of the DBR film 7C can prevent erosion (decrease in film thickness), water absorption, and cracking of the DBR top layer in etching or washing treatment in a downstream process, as described above.

In the formation of the DBR film 7C (reflective film) pattern on the device, the DBR end portion of the DBR film 7C has a gentle slope formed by vapor deposition in the lift-off process. In this case, the cross-sectional taper angle ranges from 15 to 45 degrees and has a gentle slope with the film thickness decreasing toward the edge.

Thus, the pattern edge (end) of the DBR film 7C formed in the lift-off process has a gentle slope having a predetermined cross-sectional taper angle in the range of 15 to 45 degrees, and the overlying reflective metal film 8 has no step discontinuity. Thus, a multilayer structure composed of the DBR pattern and the overlying reflective metal film 8 can be easily formed. Thus, the two-layer reflective film structure composed of the DBR film 7C and the reflective metal film 8 according to the fourth embodiment can have better reflection characteristics than known monolayer reflective film structures composed of a DBR film or a reflective metal film.

Figure 6:
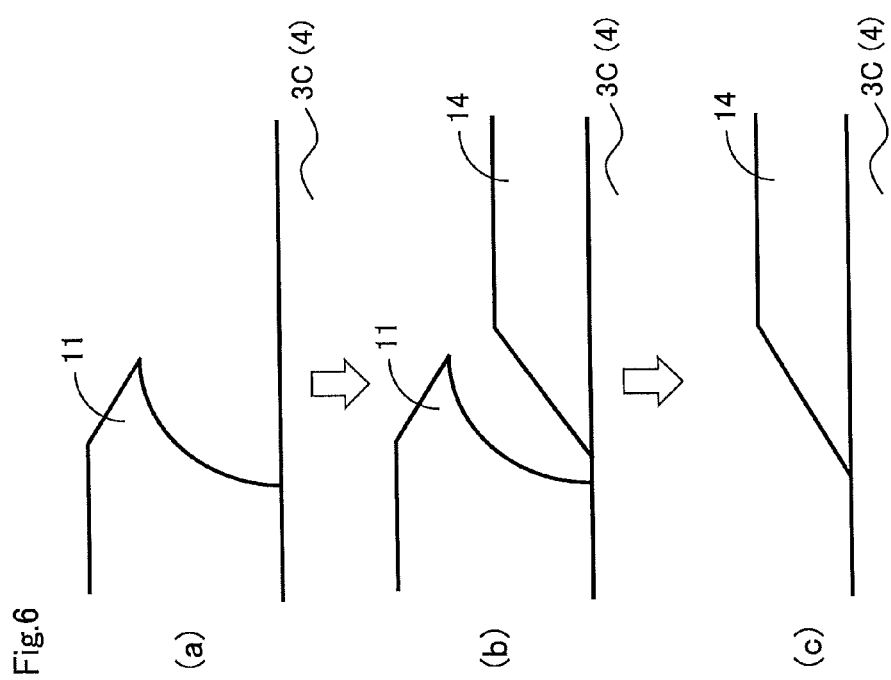
FIG. 6(a) is a cross-sectional view of a principal part illustrating a process of forming a photoresist pattern for a DBR film or a reflective metal film in a known semiconductor light-emitting device. (b) is a cross-sectional view of a principal part illustrating a process of DBR film or reflective metal film deposition in the known semiconductor light-emitting device. (c) is a cross-sectional view of a principal part illustrating a process of photoresist lift-off in the known semiconductor light-emitting device.

FIG. 6(*a*) is a cross-sectional view of a principal part illustrating a process of forming a photoresist pattern for a DBR film or a reflective metal film in a known semiconductor light-emitting device. FIG. 6(*b*) is a cross-sectional view of a principal part illustrating a process of DBR film or reflective metal film deposition in the known semiconductor light-emitting device. FIG. 6(*c*) is a cross-sectional view of a principal part illustrating a process of photoresist lift-off in the known semiconductor light-emitting device.

As illustrated in FIGS. 6(*a*) to 6(*c*), a resist pattern having an overhang in cross-section is formed on the entire surface of the light-emitting structural body 3C and the transparent electrode film 4 in a lift-off process, thereby forming a photoresist 11 for a DBR film or a reflective metal film. A sloped end portion of the DBR film or reflective metal film 14 is formed around the overhang of the photoresist 11 by vapor deposition treatment using the photoresist 11 as a mask. The photoresist 11 is then removed in a photoresist lift-off process to expose the underlying film surface of the light-emitting structural body 3C and the transparent electrode film 4 under the photoresist 11. Hitherto, such a monolayer reflective film structure composed of the DBR film or reflective metal film 14 has been formed. In contrast, the two-layer reflective film structure composed of the DBR film 7C and the reflective metal film 8 according to the fourth embodiment can have better reflection characteristics.

Hitherto, a sloped end portion of the DBR film or reflective metal film 14 has been formed by vapor deposition in a lift-off process. The sloped end portion has a cross-sectional taper angle of 60 degrees or more. Thus, the reflective metal film 8 formed on the sloped end portion suffers from step discontinuity. In contrast, in the fourth embodiment, the sloped end portion of the DBR film 7C formed in the lift-off process has a cross-sectional taper angle in the range of 15 to 45 degrees, which is smaller than the taper angle of 60 degrees at which step discontinuity is likely to occur. This can reliably prevent step discontinuity of the reflective metal film 8 on the end portion of the DBR film 7C. Thus, the two-layer reflective film structure composed of the DBR film 7C and the reflective metal film 8 according to the fourth embodiment can have high quality, can be easily formed, and can have better reflection characteristics.

Fifth Embodiment

In the fourth embodiment described above, the high-refractive-index film ($TiO_2$ film) is formed as the top layer of the DBR film 7C (reflective film), and the two-layer reflective film structure including the reflective metal film 8 on the DBR film 7 has good reflection characteristics. In a fifth embodiment described below, the DBR film structure of the DBR film includes a pair of or a plurality of pairs of a deposited $SiO_2$ film and a deposited $TiO_2$ film. Such a top layer has hitherto been a deposited $SiO_2$ film that provides high reflectance. In the fifth embodiment, the thickness of the top layer formed of a high-refractive-index film (deposited $TiO_2$ film) is limited to as small as 1 to 13 nm in order to maintain high reflectance and prevent erosion.

Figure 7:
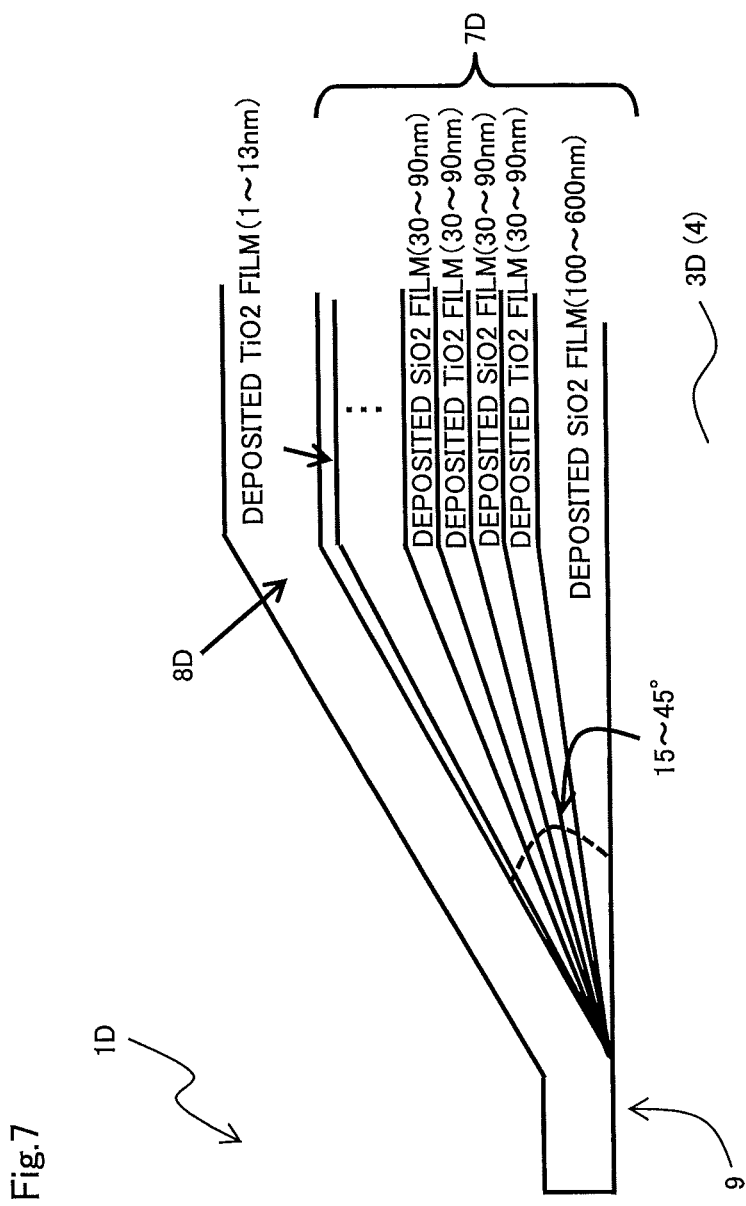
FIG. 7 is an enlarged cross-sectional view of a sloped end portion of a DBR film in a semiconductor light-emitting device according to a fifth embodiment.

FIG. 7 is an enlarged cross-sectional view of a sloped end portion of a DBR film 7D in a semiconductor light-emitting device 1D according to the fifth embodiment.

As illustrated in FIG. 7, the semiconductor light-emitting device 1D according to the fifth embodiment includes the DBR film 7D in which a tapered deposited $SiO_2$ film having a thickness in the range of 100 to 600 nm is formed on the light-emitting structural body 3D and the transparent electrode film 4 with the film thickness decreasing toward the edge. A deposited $TiO_2$ film having a thickness in the range of 30 to 90 nm is formed on the deposited $SiO_2$ film with the film thickness decreasing toward the edge. A deposited $SiO_2$ film having a thickness in the range of 30 to 90 nm is formed on the deposited $TiO_2$ film with the film thickness decreasing toward the edge. A deposited $TiO_2$ film having a thickness in the range of 30 to 90 nm is formed on the deposited $SiO_2$ film with the film thickness decreasing toward the edge. A deposited $SiO_2$ film having a thickness in the range of 30 to 90 nm is formed on the deposited $TiO_2$ film with the film thickness decreasing toward the edge. A deposited $TiO_2$ film having a predetermined small thickness in the range of 1 to 13 nm is formed as the final film on the deposited $SiO_2$ film with the film thickness decreasing toward the edge. The total taper angle ranges from 15 to 45 degrees.

In the DBR film 7D having the reflective film structure, a high-refractive-index film (deposited $TiO_2$ film) for preventing erosion is continuously formed as the final film by vapor deposition on a top low-refractive-index film (deposited $SiO_2$ film) of a pair of or a plurality of pairs of the high-refractive-index film (deposited $TiO_2$ film) and the low-refractive-index film (deposited $SiO_2$ film), as in the low-refractive-index film (deposited $SiO_2$ film)/high-refractive-index film (deposited $TiO_2$ film)/low-refractive-index film (deposited $SiO_2$ film).

In the structure of the DBR film 7D, the $TiO_2$ film having a high refractive index, which has higher water resistance and acid resistance than the $SiO_2$ film and withstands erosion with etchants, such as HF and BHF, is formed as the top layer of the DBR film 7D. The $TiO_2$ film is a thin film (having a thickness in the range of 1 to 13 nm) so that the reflectance characteristics of the $TiO_2$ film are comparable to the reflectance characteristics of known film structures.

The final film of the DBR film 7D has hitherto been the $SiO_2$ film in order to improve reflectance. In the fifth embodiment, the thickness of the $TiO_2$ film having a high refractive index is determined such that the $TiO_2$ film can have high acid resistance and water resistance while maintaining reflectance.

More specifically, the thickness of five or more layers of $SiO_2$ film/$TiO_2$ film/$SiO_2$ film/$TiO_2$ film/$SiO_2$ film in the DBR film 7D is fixed to the known film thickness, and the thickness of an additional $TiO_2$ film in six or more layers is determined so as not to change the reflectance.

As a result, when the additional top $TiO_2$ film has a thickness in the range of 1 to 5 nm (a thickness of 0 corresponds to no additional $TiO_2$ film), the reflectance is highest and is 95 percent or more in the vertical direction and in an oblique direction (at an angle of 15 degrees). When the additional top $TiO_2$ film has a thickness in the range of 5 to 10 nm, the reflectance is as high as 92 percent or more in the vertical direction and in an oblique direction but is slightly lower than the reflectance for the $TiO_2$ film thickness in the range of 1 to 5 nm. When the additional top $TiO_2$ film has a thickness in the range of 10 to 13 nm, the reflectance is as high as 90 percent or more in the vertical direction and in an oblique direction but is further slightly lower than the reflectance for the $TiO_2$ film thickness in the range of 5 to 10 nm. When the additional top $TiO_2$ film has a thickness of more than 14 nm, the reflectance is less than 90 percent in the vertical direction and in an oblique direction. When the additional top $TiO_2$ film has a thickness of 15 nm or more, the reflectance decreases drastically.

Thus, when the additional top $TiO_2$ film has a thickness in the range of 1 to 13 nm in order to achieve high reflectance, the reflectance is 90 percent or more. When the additional top $TiO_2$ film has a thickness of 5 nm, the reflectance is approximately 95 percent. Even when the additional top $TiO_2$ film has a thickness of 1 nm, the reflectance is 95 percent and is almost the same. Thus, the additional $TiO_2$ film has a thickness of approximately 5 nm (±1 nm) in this embodiment. When the $TiO_2$ film has a thickness of approximately 5 nm, or approximately 88 nm corresponding to the next cycle, or approximately 188 nm corresponding to the subsequent cycle, the reflectance can be approximately 95 percent. Because the $TiO_2$ film having a greater thickness absorbs more light, the $TiO_2$ film most preferably has a smallest thickness of 5 nm and preferably has a second smallest thickness of approximately 88 nm. In any case, when the top $TiO_2$ film of six or more DBR layers has a thickness of approximately 5 nm (±1 nm), or approximately 88 nm corresponding to the next cycle, or approximately 188 nm corresponding to the subsequent cycle, erosion prevention (acid resistance) can be most satisfactorily achieved while high reflectance is maintained.

Thus, in the fifth embodiment, the DBR film structure of the DBR film 7D includes a pair of or a plurality of pairs of a deposited $SiO_2$ film and a deposited $TiO_2$ film. Such a top layer of DBR film structures has hitherto been a deposited $SiO_2$ film that provides high reflectance. In order to prevent erosion while maintaining high reflectance, the top layer herein is a high-refractive-index thin film (for example, a deposited $TiO_2$ film) having a thickness in the range of 1 to 13 nm, and a tapered DBR end portion (a slope having a taper angle in the range of 15 to 45 degrees) is formed by vapor deposition in a lift-off process. The reflective metal film 8 serving as an electrode wiring film as well as a reflective metal film is formed as a first layer on the DBR film 7D.

In short, a high-refractive-index thin deposited $TiO_2$ film (having a thickness in the range of 1 to 13 nm) is formed as the top layer of the DBR film 7D, thereby imparting acid resistance and water resistance to the DBR film 7D while maintaining a high level of reflectance characteristics required for the DBR film 7D. In the formation of a pattern of the DBR film 7D on the device, a gently sloped DBR end portion (having a cross-sectional taper angle in the range of 15 to 45 degrees) is formed by vapor deposition in the lift-off process. Furthermore, the reflective metal film 8D is formed on the DBR film 7D without step discontinuity, thereby achieving good reflection characteristics.

Although such a top layer has hitherto been a $SiO_2$ film in consideration of reflection characteristics, formation of the $TiO_2$ film as the high-refractive-index thin film (having a thickness in the range of 1 to 13 nm) in the film formation structure of the DBR film 7C can prevent erosion (decrease in film thickness), water absorption, and cracking of the DBR top layer film in etching or washing treatment in a downstream process while maintaining a high level of optical properties (reflectance) of the DBR film 7D.

The pattern edge (end) of the DBR film 7D formed in the lift-off process has a gentle slope having a cross-sectional taper angle in the range of 15 to 45 degrees, and therefore the overlying reflective metal film 8D has no step discontinuity. Thus, a multilayer structure composed of the DBR film 7D and the overlying reflective metal film 8D can be easily formed.

In the fifth embodiment, the top layer of the DBR film 7D is the high-refractive-index thin film having a thickness in the range of 1 to 13 nm (deposited $TiO_2$ film) in consideration of high reflectance, and the top $TiO_2$ film has a sloped end (having a cross-sectional taper angle in the range of 15 to 45 degrees) so that the reflective metal film 8D has no step discontinuity. The present invention is not limited to this. Also in the case that the top $TiO_2$ film has no sloped end as in the first to third embodiments, and the reflective metal film 8D is or is not disposed on the DBR film 7D, high reflectance can be maintained by using the high-refractive-index thin film having a thickness in the range of 1 to 13 nm (deposited $TiO_2$ film) as the top layer of the DBR film as in the fifth embodiment.

Sixth Embodiment

In the fifth embodiment, the top layer of the DBR film 7D is the high-refractive-index thin film having a thickness in the range of 1 to 13 nm (deposited $TiO_2$ film), and the deposited $TiO_2$ film most preferably has a smallest thickness of approximately 5 nm and preferably has a second smallest thickness of approximately 88 nm, which corresponds to the next cycle. In this sixth embodiment, a two-layer reflective film structure will be described below. The two-layer reflective film structure is composed of a DBR film 7E and a reflective metal film 8E having an underlying Ni film or a reflective metal film 8E' having no underlying Ni film.

Reflectance as a function of wavelength is compared in detail under combinations of the following four conditions: the presence or absence of the underlying Ni film of 1st reflective metal films 8E and 8E', the thickness of the deposited $TiO_2$ top layer of the DBR film 7E in the range of 1 to 13 nm, and the thickness of the deposited $TiO_2$ top layer corresponding to the next cycle.

Figure 8:
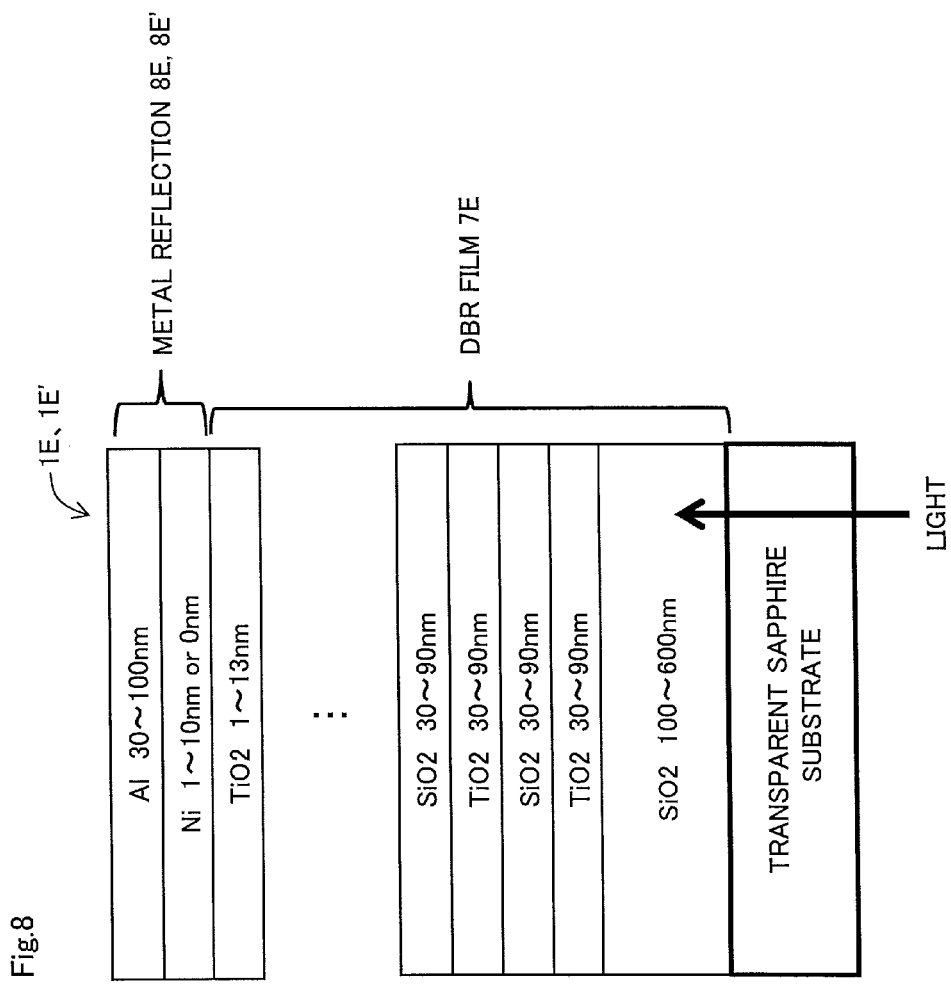
FIG. 8 is a schematic view of a multilayer state of a sample for reflectance measurement test in a test to measure the reflectance of a two-layer reflective film structure composed of a DBR film and a reflective metal film in each semiconductor light-emitting device according to a sixth embodiment.

FIG. 8 is a schematic view of a multilayer state of a sample for reflectance measurement test in a test to measure the reflectance of the two-layer reflective film structure composed of the DBR film 7E and the reflective metal film 8E or 8E' in semiconductor light-emitting devices 1E and 1E' according to the sixth embodiment.

In FIG. 8, the sample for the reflectance measurement test of the two-layer reflective film structure of the semiconductor light-emitting device 1E according to the sixth embodiment includes the DBR film 7E composed of six or more DBR layers of $SiO_2$ film/$TiO_2$ film/$SiO_2$ film/$TiO_2$ film/$SiO_2$ film/ . . . $TiO_2$ film on a transparent sapphire substrate, and theist reflective metal film 8E (Ni: 1 to 10 nm (3 nm in the present embodiment) on the DBR film 7E.

The sample for the reflectance measurement test of the two-layer reflective film structure of the semiconductor light-emitting device 1E' according to the sixth embodiment includes the DBR film 7E composed of six or more DBR layers of $SiO_2$ film/$TiO_2$ film/$SiO_2$ film/$TiO_2$ film/$SiO_2$ film/ . . . $TiO_2$ film on a transparent sapphire substrate, and theist reflective metal film 8E' (multilayer of Ni: 0 nm and Al: 30 to 100 nm) on the DBR film 7E.

Light is allowed to enter the semiconductor light-emitting devices 1E and 1E' through the back side of the transparent sapphire substrate at an incident angle of 5 degrees. The reflectance of the DBR film 7E and the reflective metal film 8E and the reflectance of the DBR film 7E and the reflective metal film 8E' are measured with a reflectance measuring instrument (spectrophotometer) as a function of wavelength.

In the semiconductor light-emitting device 1E, a thin Ni film for improving the adhesion between the DBR film 7E and the reflective metal film 8E is formed as a first layer of the reflective metal film 8E. The semiconductor light-emitting device 1E' includes the DBR film 7E and the reflective metal film 8E', which includes a second layer of Al alone and includes no thin Ni film.

In the reflectance as a function of wavelength in the case that the reflective metal film 8E is not disposed on the DBR film 7E before the measurement of reflectance (after DBR treatment) and, for example, when the $TiO_2$ top layer of six DBR layers has a thickness of 5 nm in the range of 1 to 13 nm (curve A) or 88 nm corresponding to an increase in the thickness of one cycle (curve B), although the reflectance at a wavelength of 450 nm is decreased 40 percent or less when the $TiO_2$ top layer has a thickness of 5 nm in the range of 1 to 13 nm (curve A), the reflectance in a wide wavelength range of 400 to 700 nm is approximately 40 to 50 percent when the $TiO_2$ top layer has a thickness of 5 nm in the range of 1 to 13 nm (curve A). When the $TiO_2$ top layer has a thickness of 88 nm corresponding to an increase in the thickness of one cycle from 5 nm (curve B), although the reflectance in a narrow wavelength range of 450 to 550 nm ranges from 70 to 80 percent, the reflectance at a wavelength of approximately 700 nm is greatly decreased to 10 percent or less.

Figure 9:
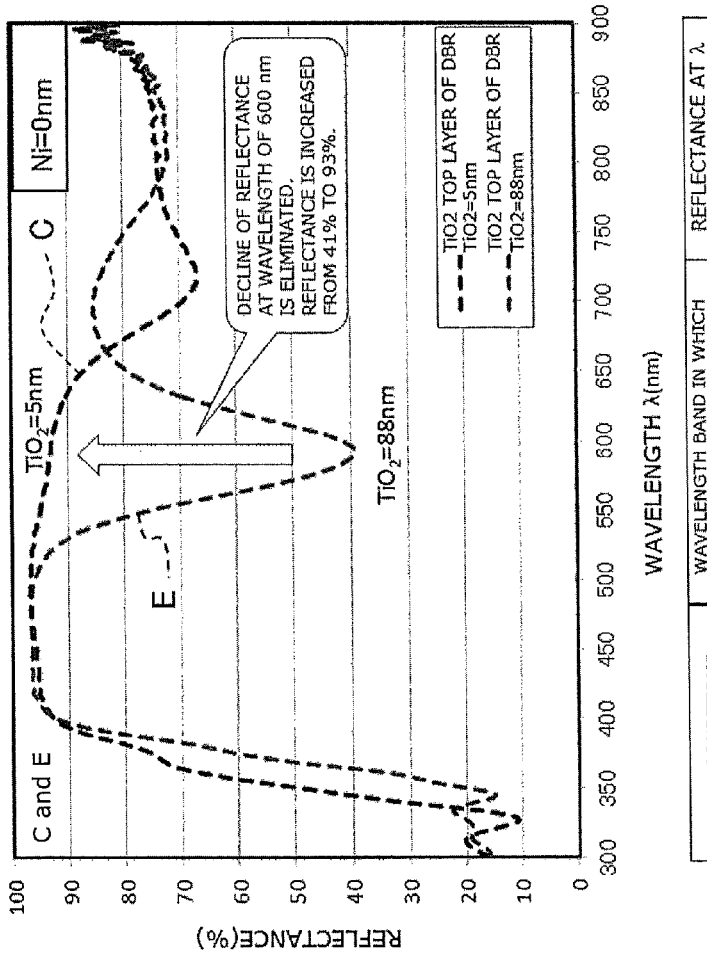
FIG. 9 is a graph of reflectance as a function of wavelength in the reflectance measurement test illustrated in FIG. 8 in which the thickness of an underlying Ni film of a 1st reflective metal film is 0 nm, and the thickness of a $TiO_2$ top layer of six DBR layers is 5 nm (curve C) or 88 nm corresponding to an increase in the thickness of one cycle (curve E).

FIG. 9 is a graph of reflectance as a function of wavelength in the reflectance measurement test illustrated in FIG. 8 in which the thickness of the underlying Ni film of the 1st reflective metal film 8E' is 0 nm, and the thickness of the $TiO_2$ top layer of the six DBR layers is 5 nm (curve C) or 88 nm corresponding to an increase in the thickness of one cycle (curve E).

As illustrated in FIG. 9, the reflectance at a wavelength of 600 nm is decreased to 40 percent in the curve E when the underlying Ni film of the 1st reflective metal film has a thickness of 0 nm and the $TiO_2$ top layer of the six DBR layers has a thickness of 88 nm corresponding to an increase in the thickness of one cycle, but is improved to 93 percent in the curve C when the underlying Ni film of the 1st reflective metal film 8E' has a thickness of 0 nm and the $TiO_2$ top layer of the six DBR layers has a thickness of 5 nm. Thus, the reflectance at a wavelength of 600 nm for the case that the underlying Ni film of the 1st reflective metal film has a thickness of 0 nm and the $TiO_2$ top layer of the six DBR layers has a small thickness of 5 nm is greatly improved by 52 percent as compared with that for the case that the TiO$_2$ film has a thickness of 88 nm corresponding to an increase in the thickness of one cycle. The width of a wavelength band in which the reflectance is 90 percent or more is also greatly increased to 243 nm.

Figure 10:
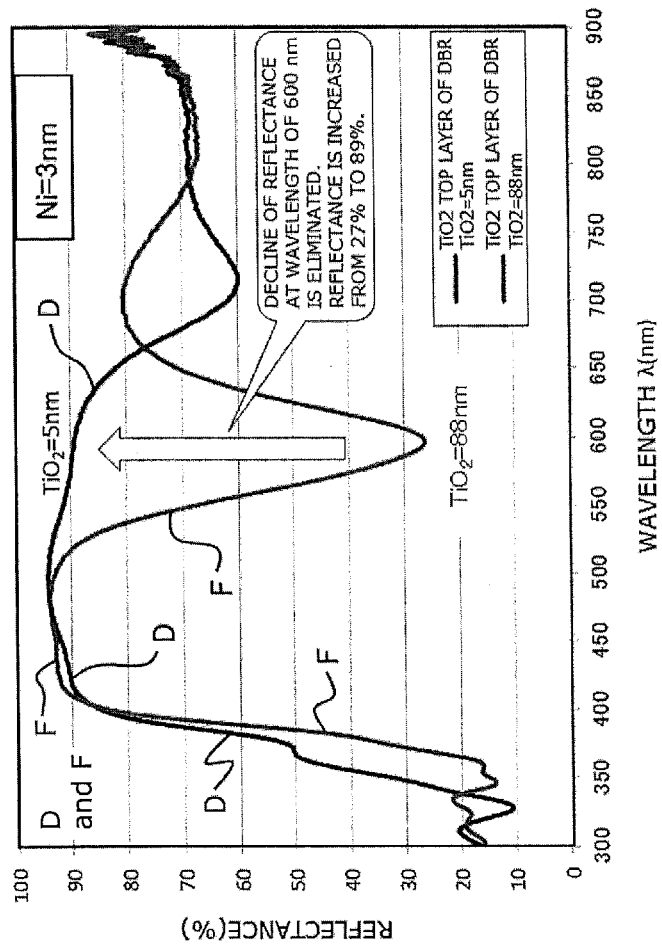
FIG. 10 is a graph of reflectance as a function of wavelength in the reflectance measurement test illustrated in FIG. 8 in which the thickness of the underlying Ni film of the 1st reflective metal film is 3 nm, and the thickness of the $TiO_2$ top layer of the six DBR layers is 5 nm (curve D) or 88 nm corresponding to an increase in the thickness of one cycle (curve F).

FIG. 10 is a graph of reflectance as a function of wavelength in the reflectance measurement test illustrated in FIG. 8 in which the thickness of the underlying Ni film of the 1st reflective metal film 8E is 3 nm, and the thickness of the TiO$_2$ top layer of the six DBR layers is 5 nm (curve D) or 88 nm corresponding to an increase in the thickness of one cycle (curve F).

As illustrated in FIG. 10, the reflectance at a wavelength of 600 nm is decreased to 27 percent in the curve F for the case that the underlying Ni film of the 1st reflective metal film has a thickness of 3 nm and the TiO$_2$ top layer of the six DBR layers has a thickness of 88 nm corresponding to an increase in the thickness of one cycle, but is improved to 89 percent in the curve D for the case that the underlying Ni film of the 1st reflective metal film 8E has a thickness of 3 nm and the TiO$_2$ top layer of the six DBR layers has a thickness of 5 nm. Thus, the reflectance at a wavelength of 600 nm for the case that the underlying Ni film of the 1st reflective metal film 8E has a thickness of 3 nm and the TiO$_2$ top layer of the six DBR layers has a small thickness of 5 nm is greatly improved by 62 percent as compared with that for the case that the TiO$_2$ film has a thickness of 88 nm corresponding to an increase in the thickness of one cycle. The width of a wavelength band in which the reflectance is 90 percent or more is also greatly increased to 177 nm. The reflectance at a wavelength of 450 nm is approximately 90 percent or more and is substantially the same in both cases that the TiO$_2$ top layer of the six DBR layers has a thickness of 5 nm and 88 nm corresponding to an increase in the thickness of one cycle.

The reflectance measurement results as a function of wavelength in FIGS. 9 and 10 show that the DBR film including the TiO$_2$ top layer having a thickness of 5 nm has a wider wavelength band in which the reflectance is 90 percent or more than the DBR film including the TiO$_2$ top layer having a thickness of 88 nm corresponding to an increase in the thickness of one cycle, has a wide wavelength band in which the reflectance is 90 percent or more at 400 to 600 nm, and is superior in wavelength band width. As a matter of course, as illustrated in FIG. 8, the reflectance in the absence of the reflective metal film 8E or 8E' is approximately 50 percent for the case that the TiO$_2$ top layer has a thickness of 5 nm. Thus, high reflectance cannot be achieved in the absence of the reflective metal film 8E or 8E' on the DBR film 7E.

The reflectance at a wavelength of, for example, 450 nm is improved by 3.6 percent in the curve C for the case that the TiO$_2$ top layer of the six DBR layers has a thickness of 5 nm and the underlying Ni film of the 1st reflective metal film 8E' has a thickness of 0 nm as compared with the curve D for the case that the TiO$_2$ top layer of the six DBR layers has a thickness of 5 nm and the underlying Ni film of the 1st reflective metal film 8E has a thickness of 3 nm. In short, the underlying Ni film thickness of 0 nm results in high reflectance.

The reflectance at a wavelength of, for example, 450 nm is improved by 3.2 percent in the curve E for the case that the TiO$_2$ top layer of the six DBR layers has a thickness of 88 nm and the underlying Ni film of the 1st reflective metal film has a thickness of 0 nm as compared with the curve F for the case that the TiO$_2$ top layer of the six DBR layers has a thickness of 88 nm and the underlying Ni film of the 1st reflective metal film has a thickness of 3 nm. The underlying Ni film thickness of 0 nm also results in high reflectance. As described above, the reflectance at a wavelength of 600 nm is decreased to 27 and 41 percent in the curves E and F.

The reflectance measurement results as a function of wavelength show that the reflectance is higher (approximately 3 to 4 percent at a wavelength of 450 nm) when the underlying Ni film of the 1st reflective metal film has a thickness of 0 nm (curves C and E) than when the underlying Ni film thickness has a thickness of 3 nm (curves D and F). The width of a wavelength band in which the reflectance is 90 percent or more is also greatly increased.

Thus, although the reflection characteristics are improved when the underlying Ni film of the 1st reflective metal film has a thickness of 0 nm, the presence of the underlying Ni film improves adhesion between the DBR film 7E and 1st reflective metal film 8E electrodes. Although an underlying Ni film thickness of 0 nm does not necessarily result in separation of the electrodes, the presence of the underlying Ni film increases the reliability of adhesion between the electrodes.

Thus, in the sixth embodiment, a decrease in the thickness of the TiO$_2$ film of the sixth DBR layer (top layer) from 88 to 5 nm has the following effects.

(1) A decline of the reflectance waveform at a wavelength of 600 nm is eliminated. The reflectance is increased from 27 to 89 percent when the underlying Ni film thickness is increased to 3 nm.

(2) The high-reflectance band width is increased as compared with the case that the TiO$_2$ film has a thickness of 88 nm. The reflectance is 90 percent or more at a wavelength in the range of 415 to 592 nm (when the underlying Ni film thickness has 3 nm).

A decrease in the thickness of the Ni bottom layer of the 1st reflective metal film 8E from 3 to 0 nm (1st reflective metal film 8E') has the following effects.

(1) The reflectance is improved in substantially the whole wavelength region. The reflectance at a wavelength of 450 nm is improved by 3.6 percent from 91.9 to 95.5 percent (when the TiO$_2$ film of the sixth DBR layer has a thickness of 5 nm).

(2) The width of a wavelength band in which the reflectance is 90 percent or more is wider when the Ni bottom layer has a thickness of 0 nm than when the Ni bottom layer has a thickness of 3 nm. For example, when the TiO$_2$ film of the sixth DBR layer has a thickness of 5 nm, the wavelength band is increased from the range of 415 to 592 nm to the range of 394 to 637 nm.

Although the semiconductor light-emitting devices 1, 1A to 1E, and 1E' and a method for producing the semiconductor light-emitting devices are described in the first to sixth embodiments, the present invention may be applied to any semiconductor devices and methods for producing the semiconductor devices. In short, also in such cases, the present invention may be applied to any semiconductor device that includes one of the DBR films 7 and 7A to 7E and one of the reflective metal films 8, 8D, 8E, and 8E' as a first layer on the DBR film, and to a method for producing such a semiconductor device. In one of the DBR films 7 and 7A to 7E, in the same manner as described above, a high-refractive-index TiO$_2$ film for preventing erosion is continuously formed as the final film on a low-refractive-index SiO$_2$ film in a pair of or a plurality of pairs of the high-refractive-index TiO$_2$ film and the low-refractive-index SiO$_2$ film formed on the low-refractive-index SiO$_2$ film. A reflective metal film corresponding to one of the reflective metal films 8, 8D, 8E, and 8E' is formed on the DBR film as a first layer.

Although not particularly described in the sixth embodiment, comparing a monolayer reflective film structure composed of a reflective metal (Al) film with a two-layer reflective film structure composed of the DBR film 7E and a reflective metal (Al) film, the DBR film 7E disposed under the monolayer reflective film structure composed of the reflective metal (Al) film can improve reflectance as a function of wavelength.

Figure 11:
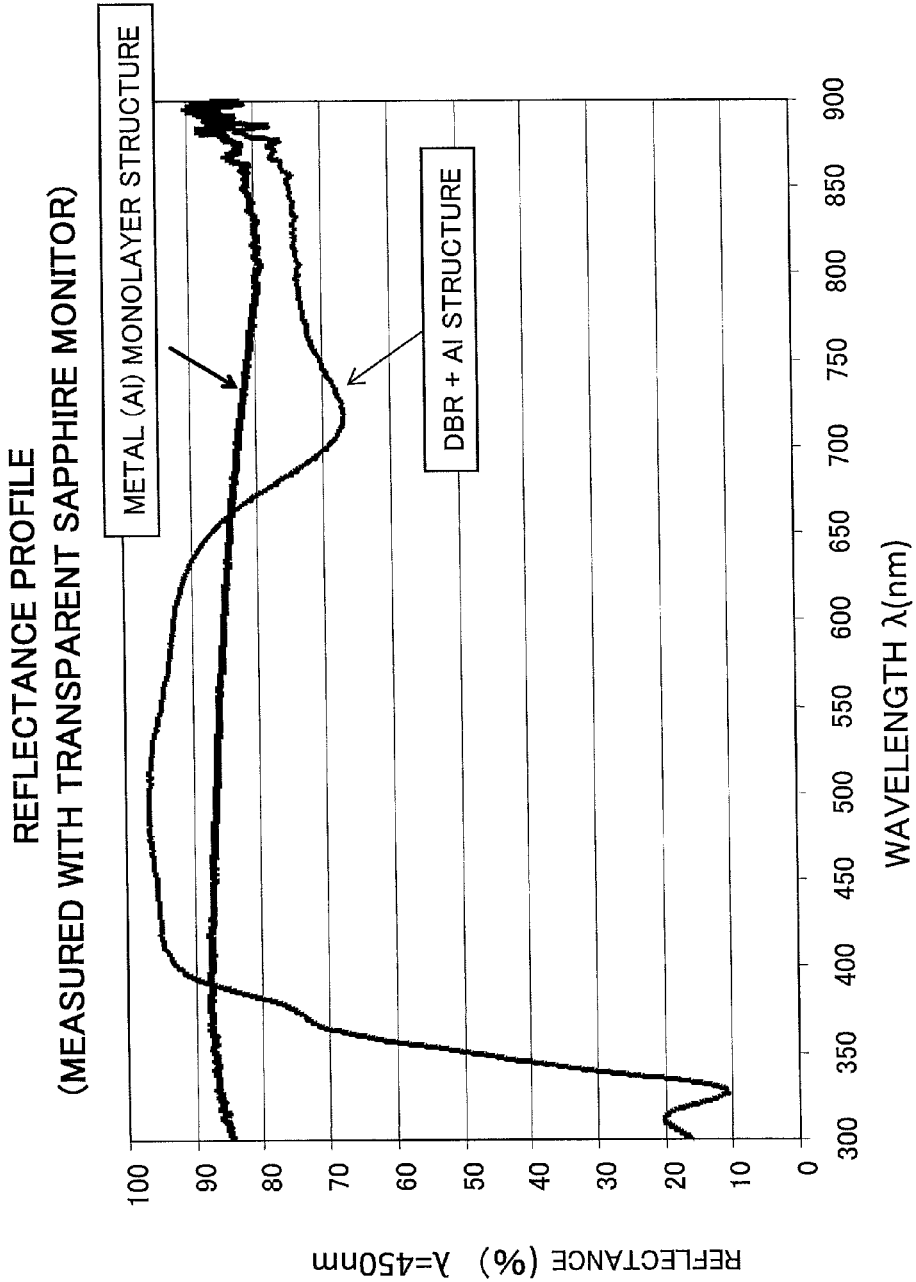
FIG. 11 is a reflectance profile as a function of wavelength for a monolayer reflective film structure composed of a reflective metal film, and a reflectance profile as a function of wavelength for a two-layer reflective film structure composed of a DBR film and a reflective metal film in each semiconductor light-emitting device according to the sixth embodiment.
Figure 12:
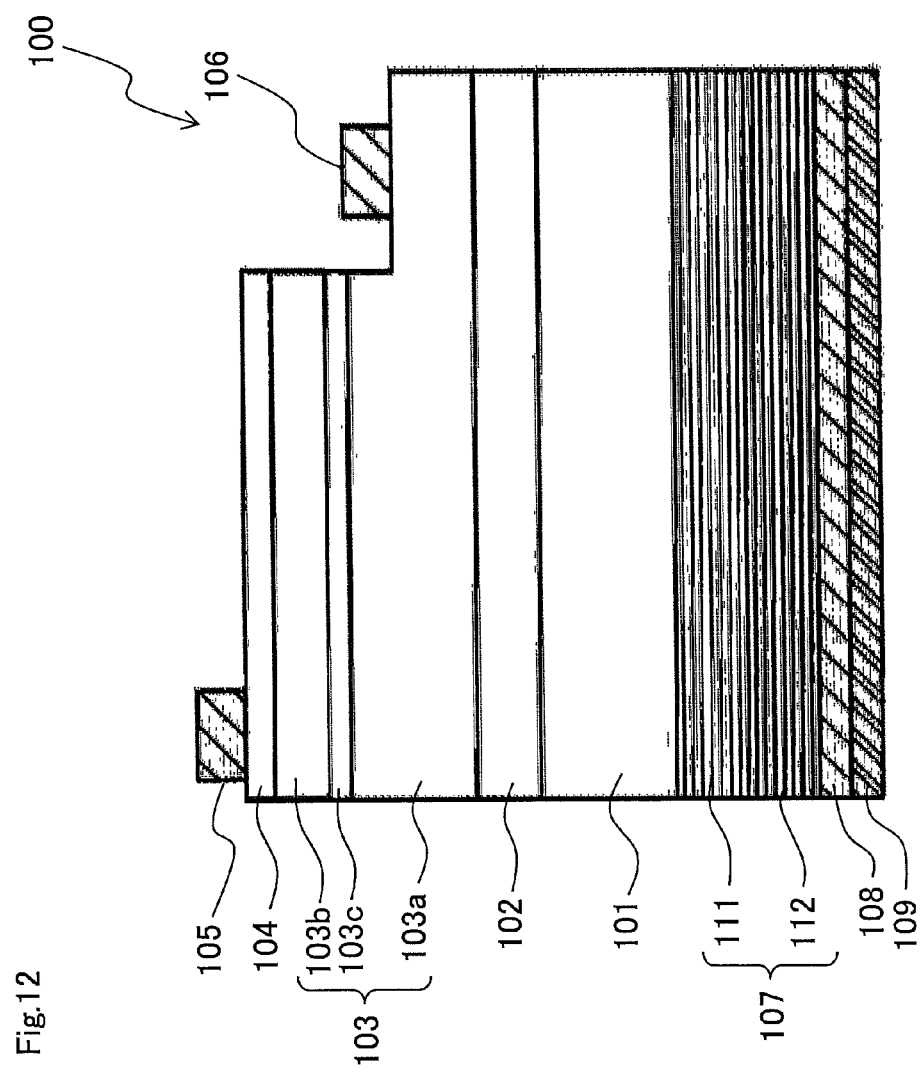
FIG. 12 is a cross-sectional view illustrating a known light-emitting diode chip having a distributed Bragg reflector disclosed in Patent Literature 1.
Figure 13:
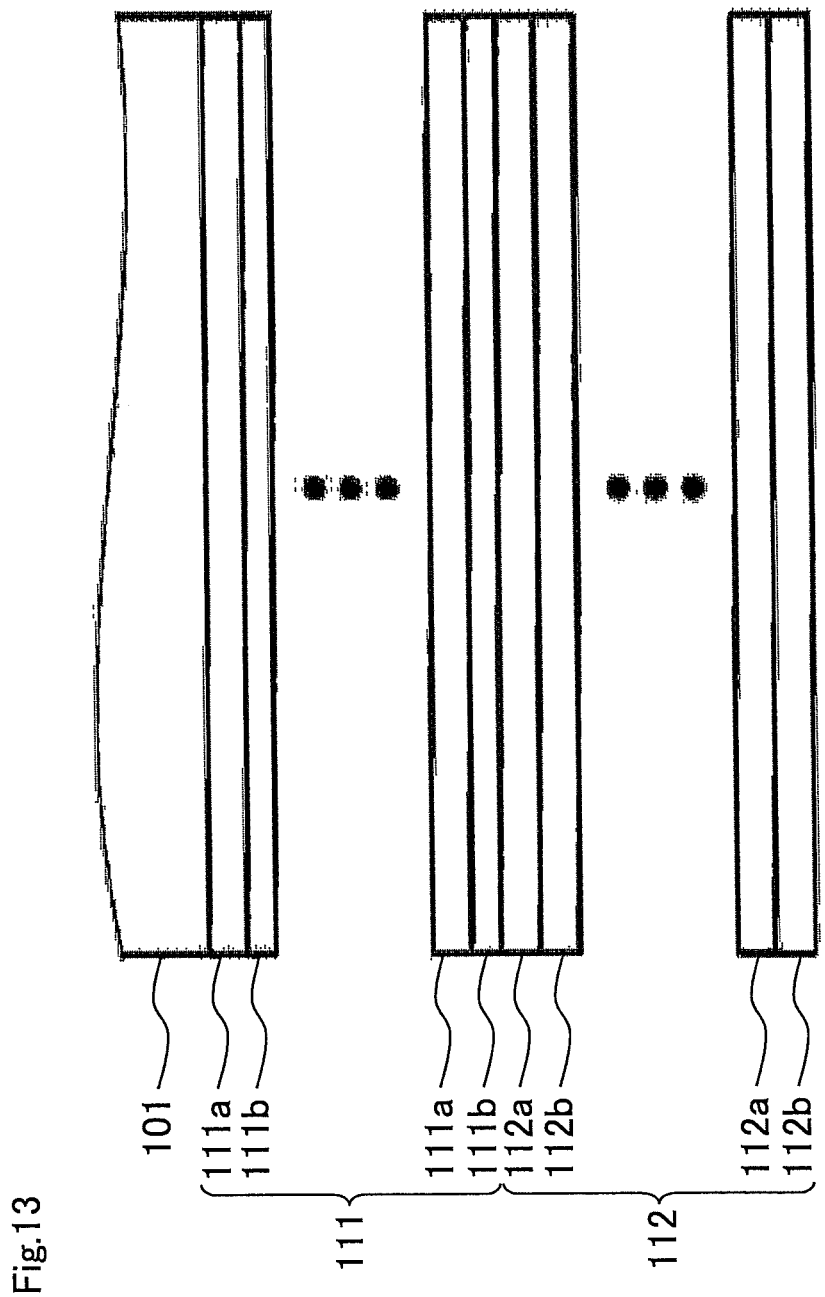
FIG. 13 is an enlarged cross-sectional view of the distributed Bragg reflector of FIG. 12.

FIG. 11 is a reflectance profile as a function of wavelength for a monolayer reflective film structure composed of a reflective metal film, and a reflectance profile as a function of wavelength for a two-layer reflective film structure composed of the DBR film 7E and the reflective metal (Al) film 8E or 8E' in each semiconductor light-emitting device according to the sixth embodiment.

FIG. 11 shows that the reflectance of the two-layer reflective film structure composed of the DBR film 7E and the reflective metal (Al) film 8E or 8E' at a wavelength in the range of approximately 380 to 660 nm is higher than the reflectance of the monolayer reflective film structure composed of the reflective metal (Al) film 8E or 8E'. The width of the band in which the reflectance is 90 percent or more is as wide as 243 nm (394 to 637 nm) in the two-layer reflective film structure. Thus, when the DBR film 7E is disposed under the monolayer reflective film structure of the reflective metal (Al) film 8E or 8E', the width of the band in which the reflectance is 90 percent or more can be as wide as 243 nm (394 to 637 nm), and high reflectance (percent) can be achieved.

Although not particularly described in the fourth embodiment, a photoresist in the lift-off process may be a photoresist film and includes a photoresist film having a planar size smaller than its thickness, which may not be referred to as a film.

In the first to sixth embodiments, the material of the low-refractive-index film is $SiO_2$, and the material of the high-refractive-index film is $TiO_2$. The present invention is not limited to this. The material of the low-refractive-index film may be $SiO_2$ or SiO, and the material of the high-refractive-index film may be any one of $TiO_2$, $Ti_3O_5$, $Ti_2O_3$, TiO, $ZrO_2$, $TiO_2ZrO_2Nb_2O_5$, and $Al_2O_3$.

Although the present invention is described with the preferred first to sixth embodiments, the present invention should not be limited to the first to sixth embodiments. It should be understood that the scope of the present invention is defined by the appended claims. It should be understood by those skilled in the art that equivalents of the specific preferred first to sixth embodiments of the present invention may occur from the description of the present invention and common general technical knowledge. It should be understood that all the patents, patent applications, and literature cited in the present specification are incorporated herein by reference in their entirety as if set forth fully herein.

INDUSTRIAL APPLICABILITY

According to the present invention, in the fields of semiconductor devices, for example, semiconductor light-emitting devices, such as light-emitting diode devices and semiconductor laser devices, having a distributed Bragg reflector and methods for producing the semiconductor devices, since the final film is the high-refractive-index film for preventing erosion, the high-refractive-index film for preventing erosion covers and protects the DBR film structure, thereby suppressing or preventing erosion (decrease in film thickness), water absorption, or cracking of the DBR film surface in washing or etching treatment in a downstream process.

The invention claimed is:

1. A semiconductor light-emitting device, comprising:
    a light-emitting structural body including an active layer that emits light; and
    a DBR film structure serving as a reflective film, the DBR film structure including:
        an inner low-refractive-index film;
        a pair of or a plurality of continuously formed pairs of a high-refractive-index film and a low-refractive-index film formed on the inner low-refractive-index film in this order from an inner side to an outer side; and
        a thin film with a high-refractive-index formed on the low-refractive-index film in the pair of or an outermost pair among the plurality of continuously formed pairs of the high-refractive-index film and the low-refractive-index film; wherein
    the thin film with the high-refractive-index is thinner than the high-refractive-index film, and formed, as a final outermost film serving as a surface of the DBR film structure, to protect the interior of the DBR film structure;
    the inner low-refractive-index film is closer to the active layer than any other film included in the DBR film structure; and
    the final outermost film is farther from the active layer than an other film included in the DBR film structure.

2. The semiconductor light-emitting device according to claim 1, wherein the low-refractive-index film is a $SiO_2$ film, the high-refractive-index film is a $TiO_2$ film, and the thin film with the high-refractive-index is a $TiO_2$ film having a thickness in the range of 1 to 13 nm.

3. The semiconductor light-emitting device according to claim 1, wherein the DBR film structure has a sloped pattern edge portion, and the thickness of the pattern edge portion decreases toward an edge at a cross-sectional taper angle in the range of 15 to 45 degrees.

4. The semiconductor light-emitting device according to claim 1, further comprising a metal film on the DBR film structure and on an underlayer of the DBR film structure.

5. A method for producing the semiconductor light-emitting device according to claim 3, comprising a lift-off process of forming a resist pattern having an overhang in cross-section, forming the slope of the DBR film structure around the overhang of the resist pattern by DBR vapor deposition treatment, and removing the resist pattern.

* * * * *